United States Patent
Ke

(10) Patent No.: US 11,088,129 B2
(45) Date of Patent: Aug. 10, 2021

(54) DISPLAY APPARATUS

(71) Applicant: Au Optronics Corporation, Hsinchu (TW)

(72) Inventor: Tsung-Ying Ke, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 1 day.

(21) Appl. No.: 16/502,046

(22) Filed: Jul. 3, 2019

(65) Prior Publication Data

US 2020/0312829 A1    Oct. 1, 2020

(30) Foreign Application Priority Data

Mar. 28, 2019   (TW) .................................. 108111003

(51) Int. Cl.
| | | |
|---|---|---|
| *G06F 3/041* | (2006.01) | |
| *H01L 25/18* | (2006.01) | |
| *H01L 23/00* | (2006.01) | |
| *H01L 27/32* | (2006.01) | |

(52) U.S. Cl.
CPC ............ *H01L 25/18* (2013.01); *G06F 3/0412* (2013.01); *H01L 24/32* (2013.01); *H01L 27/3262* (2013.01); *H01L 27/3276* (2013.01); *H01L 2224/32145* (2013.01); *H01L 2227/323* (2013.01)

(58) Field of Classification Search
None
See application file for complete search history.

(56) References Cited

U.S. PATENT DOCUMENTS

| | | |
|---|---|---|
| 9,431,450 B2 | 8/2016 | Umebayashi et al. |
| 9,501,165 B2 | 11/2016 | Kim et al. |
| 9,570,499 B2 | 2/2017 | Umebayashi et al. |
| 9,917,131 B2 | 3/2018 | Umebayashi et al. |
| 10,128,301 B2 | 11/2018 | Umebayashi et al. |
| 2015/0044792 A1 | 2/2015 | Aoyama et al. |

(Continued)

FOREIGN PATENT DOCUMENTS

| | | |
|---|---|---|
| CN | 104752484 | 7/2015 |
| CN | 105845708 | 8/2016 |

(Continued)

OTHER PUBLICATIONS

Kazunori Watanabe et al., "An 8.67-in. Foldable OLED Display with an In-cell Touch Sensor," SID Symposium Digest of Technical Papers, vol. 46, Jul. 2015, pp. 246-249.

*Primary Examiner* — Brian M Butcher
(74) *Attorney, Agent, or Firm* — JCIPRNET

(57) ABSTRACT

A display apparatus includes a substrate, a first circuit layer, a first adhesive layer, a second circuit layer, a first conductive element and a display element layer. The first circuit layer is disposed on the substrate. The first adhesive layer is disposed on the first circuit layer. The second circuit layer is disposed on the first adhesive layer. The first conductive element is disposed on the second circuit layer and is electrically connected to the second circuit layer. The first adhesive layer has a first via, and the first conductive element is electrically connected to the first circuit layer through the first via of the first adhesive layer. The display element layer is disposed on the second circuit layer and is electrically connected to the second circuit layer.

12 Claims, 17 Drawing Sheets

(56) References Cited

U.S. PATENT DOCUMENTS

| | | | |
|---|---|---|---|
| 2015/0185942 A1 | 7/2015 | Kim et al. | |
| 2015/0214286 A1* | 7/2015 | Niu | H01L 27/1244 257/72 |
| 2015/0270307 A1 | 9/2015 | Umebayashi et al. | |
| 2015/0309377 A1* | 10/2015 | Choi | G02F 1/1368 349/43 |
| 2015/0311260 A1 | 10/2015 | Senda et al. | |
| 2016/0218135 A1 | 7/2016 | Umebayashi et al. | |
| 2017/0148839 A1 | 5/2017 | Umebayashi et al. | |
| 2018/0122850 A1 | 5/2018 | Umebayashi et al. | |
| 2018/0350867 A1 | 12/2018 | Umebayashi et al. | |

FOREIGN PATENT DOCUMENTS

| | | |
|---|---|---|
| CN | 106601772 | 4/2017 |
| CN | 107425021 | 12/2017 |

\* cited by examiner

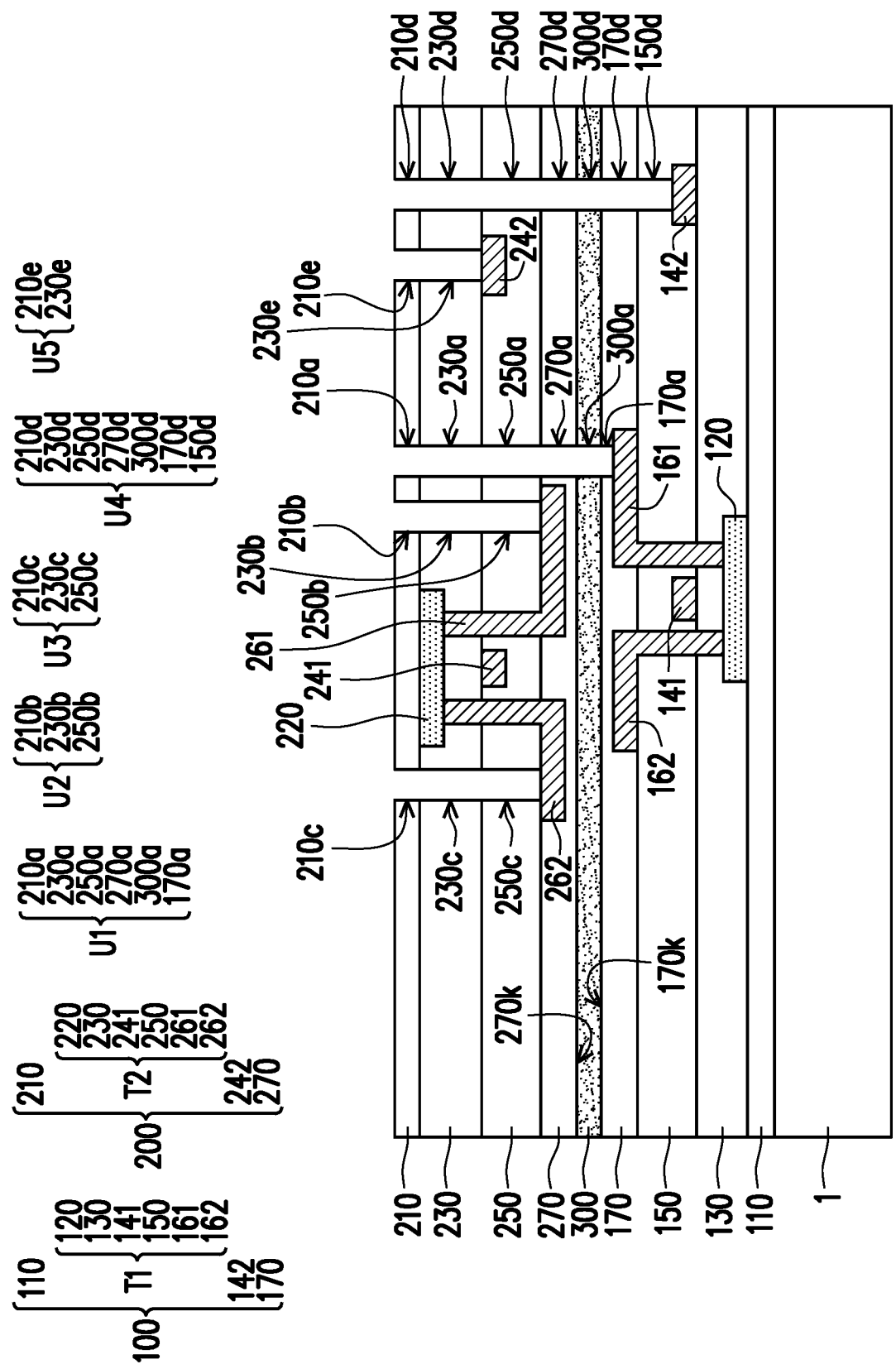

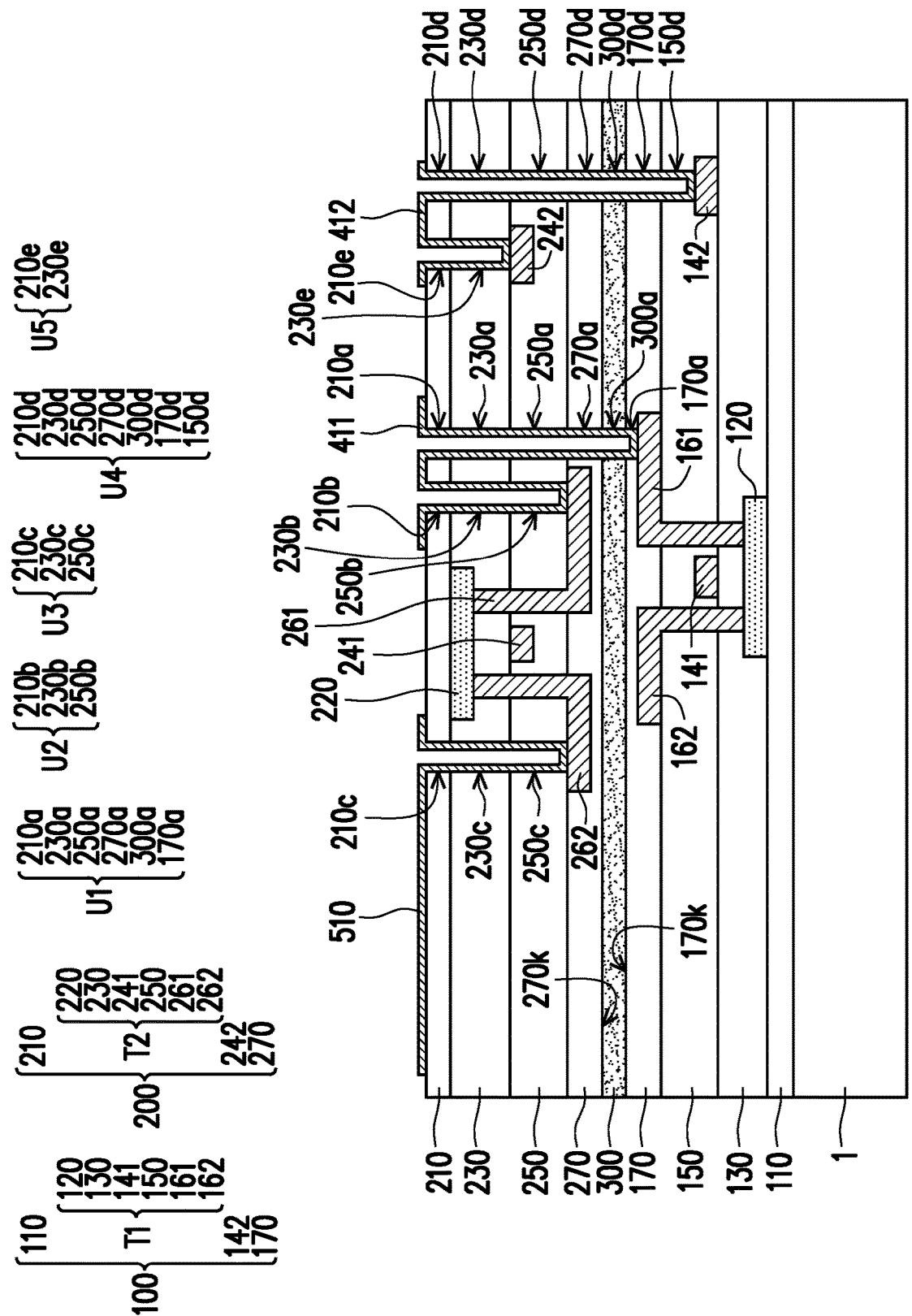

DISPLAY APPARATUS

CROSS-REFERENCE TO RELATED APPLICATION

This application claims the priority benefit of Taiwan application serial no. 108111003, filed on Mar. 28, 2019. The entirety of the above-mentioned patent application is hereby incorporated by reference herein and made a part of this specification.

BACKGROUND

Technical Field

The disclosure relates to an electronic apparatus, and in particular to a display apparatus.

Description of Related Art

As the technology industry becomes more prosperous day by day, display apparatuses such a mobile phone, a tablet computer or an eBook are broadly applied in daily lives. Especially in recent years, with the advent of multi-media applications such as stereoscopic display and virtual reality, demands for display apparatus of ultra-high resolution are gradually increasing in order to provide an astonishing visual effect.

With resolution of a display apparatus continuously increasing, designing a driving circuit beneath a display element layer with a stack layer structure to solve a shortage of layout space of the driving circuit is one of the solutions. However, using a method of the stack layer structure would inevitably increase manufacturing difficulties and production costs. Therefore, how to decrease the manufacturing difficulties and the production costs under the stack layer structure adopted by a design of the driving circuit is an important issue.

SUMMARY

The disclosure provides a display apparatus, which may be manufactured easily.

The display apparatus of an embodiment of the disclosure includes a substrate, a first circuit layer, a first adhesive layer, a second circuit layer, a first conductive element, and a display element layer. The first circuit layer is disposed on the substrate. The first adhesive layer is disposed on the first circuit layer. The second circuit layer is disposed on the first adhesive layer. The first conductive element is disposed on the second circuit layer and is electrically connected to the second circuit layer. The first adhesive layer has a first via, and the first conductive element is electrically connected to the first circuit layer through the first via of the first adhesive layer. The display element layer is disposed on the second circuit layer and is electrically connected to the second circuit layer.

In an embodiment of the disclosure, the second circuit layer includes a thin-film transistor having a gate, a semiconductor pattern and an insulating sublayer disposed between the gate and the semiconductor pattern. The insulating sublayer has a first via disposed outside of the semiconductor pattern; the first conductive element is electrically connected to the first circuit layer through the first via of the insulating sublayer of the thin-film transistor of the second circuit layer and the first via of the first adhesive layer.

In an embodiment of the disclosure, the first via of the insulating sublayer of the thin-film transistor of the second circuit layer and the first via of the first adhesive layer are substantively aligned.

In an embodiment of the disclosure, the first circuit layer includes a thin-film transistor, and the first conductive element is electrically connected to the thin-film transistor of the first circuit layer and the thin-film transistor of the second circuit layer.

In embodiment of the disclosure, the first circuit layer further includes a bus line, and the thin-film transistor of the first circuit layer is electrically connected to the bus line of the first circuit layer; the second circuit layer further includes a bus line, and the thin-film transistor of the second circuit layer is electrically connected to the bus line of the second circuit layer. The display apparatus further includes a second conductive element disposed on the second circuit layer and electrically connected to the bus line of the second circuit layer. The insulating sublayer of the thin-film transistor of the second circuit layer further has a second via disposed outside of the semiconductor pattern, and the first adhesive layer further has a second via, and the second conductive element is electrically connected to the bus line of the first circuit layer through the second via of the insulating sublayer of the thin-film transistor of the second circuit layer and the second via of the first adhesive layer.

In an embodiment of the disclosure, the display apparatus further includes a second adhesive layer, a third element layer and a third conductive element. The second adhesive layer is disposed between the first circuit layer and the substrate. The third element layer includes a bus line, wherein the bus line of the third element layer is disposed between the second adhesive layer and the substrate. The third conductive element is disposed on the first circuit layer and is electrically connected to the thin-film transistor of the first circuit layer. The third conductive element is electrically connected to the bus line of the third element layer through a via of the second adhesive layer.

In an embodiment of the disclosure, the thin-film transistor of the first circuit layer has a gate, a semiconductor pattern, and an insulating sublayer disposed between the gate and the semiconductor pattern. The insulating sublayer of the first circuit layer has a via disposed outside of the semiconductor pattern and the first circuit layer. The third conductive element is electrically connected to the bus line of the third element layer through the via of the insulating sublayer of the thin-film transistor of the first circuit layer and the via of the second adhesive layer.

In an embodiment of the disclosure, the via of the insulating sublayer of the thin-film transistor of the first layer circuit and the via of the second adhesive layer are substantively aligned.

In an embodiment of the disclosure, the first circuit layer includes a bus line, and the first conductive element is electrically connected to the bus line of the first circuit layer and the thin-film transistor of the second circuit layer.

In an embodiment of the disclosure, the first conductive element includes a first portion and a second portion. The first portion is at least disposed to the first via of the first adhesive layer. The second portion is at least disposed to the first via of the insulating sublayer of the thin-film transistor of the second circuit layer, wherein the first portion and the second portion has an interface.

In an embodiment of the disclosure, the thin-film transistor of the second circuit layer further has a first electrode and a second electrode electrically connected to two different areas of the semiconductor patter respectively. At least a part of the first conductive element, the first electrode of the thin-film transistor of the second circuit layer, and the second electrode of the thin-film transistor of the second circuit layer form in a same film layer.

In an embodiment of the disclosure, the display element layer includes a pixel electrode, a pixel defining sublayer, an organic electroluminescent material, and a common electrode. The pixel electrode is disposed on the second circuit layer, and is electrically connected to the second circuit layer. The pixel defining layer is disposed on the pixel electrode, and has a via overlapping the pixel electrode. The organic electroluminescent material is disposed in the via of the pixel defining sublayer. The common electrode is disposed on the organic electroluminescent material. A part of the first conductive element is disposed between the pixel defining sublayer and the second circuit layer.

In an embodiment of the disclosure, a part of the first conductive element is conformally disposed in a groove defined by the first via of the first adhesive layer.

The disclosure provides a display apparatus having a touch function and a good bending tolerance.

An apparatus of an embodiment of the disclosure includes a substrate, a circuit layer, a display element layer, a pad, a first adhesive layer, a touch element layer, and a conductive element. The circuit layer is disposed on the substrate. The display element layer is disposed on the circuit layer and is electrically connected to the circuit layer. The pad is disposed on the substrate. The first adhesive layer is disposed on the display element layer. The touch element layer is disposed on the first adhesive layer. The conductive element is disposed on the touch element layer and is electrically connected to the touch element layer. The first adhesive layer has a via, and the conductive element is electrically connected to the pad through the via of the first adhesive layer.

In an embodiment of the disclosure, the touch element layer includes a sensing electrode, a peripheral wiring, and an insulating sublayer. The sensing electrode and the peripheral wiring are electrically connected with each other. The insulating sublayer is disposed between the sensing electrode and the first adhesive layer and between the peripheral wiring and the first adhesive layer, and has a via. The conductive element is electrically connected to the peripheral wiring, and is electrically connected to the pad through the via of the insulating sublayer and the via of the first adhesive layer.

In an embodiment of the disclosure, the via of the insulating sublayer and the via of the first adhesive layer are substantively aligned.

In an embodiment of the disclosure, the conductive element includes a first portion and a second portion. The first portion is at least disposed to the via of the first adhesive layer. The second portion is at least disposed to the via of the insulating sublayer, wherein the first portion and the second portion has an interface.

In an embodiment of the disclosure, the display apparatus further includes a second adhesive layer and a covering plate. The second adhesive layer is disposed on the touch element layer, and a part of the conductive element is disposed between the second adhesive layer and the touch element layer. The covering plate is disposed on the second adhesive layer.

In an embodiment of the disclosure, the touch element layer includes a sensing electrode, a peripheral wiring, an insulating sublayer and a buffering sublayer. The sensing electrode and the peripheral wiring are electrically connected to each other; the sensing electrode and the peripheral wiring are disposed between the insulating sublayer and the buffering sublayer; the insulating sublayer is disposed between the sensing electrode and the first adhesive layer and between the peripheral wiring and the first adhesive layer; the buffering sublayer is disposed between the sensing electrode and the second adhesive layer and between the peripheral wiring and the second adhesive layer; the conductive element is disposed on the buffering sublayer and is electrically connected to the peripheral wiring through a via of the buffering sublayer.

In an embodiment of the disclosure, a part of the conductive element is conformally disposed to a grove defined by the via of the first adhesive layer.

In order to make the features and advantages of the disclosure mentioned above more understandable, embodiments will be described in detail below with reference to the accompanying drawings.

BRIEF DESCRIPTION OF THE DRAWINGS

FIG. 1A-FIG. 1E are sectional schematic views of a manufacturing process of a display apparatus of a first embodiment of the disclosure.

DESCRIPTION OF THE EMBODIMENTS

Figure 1A:
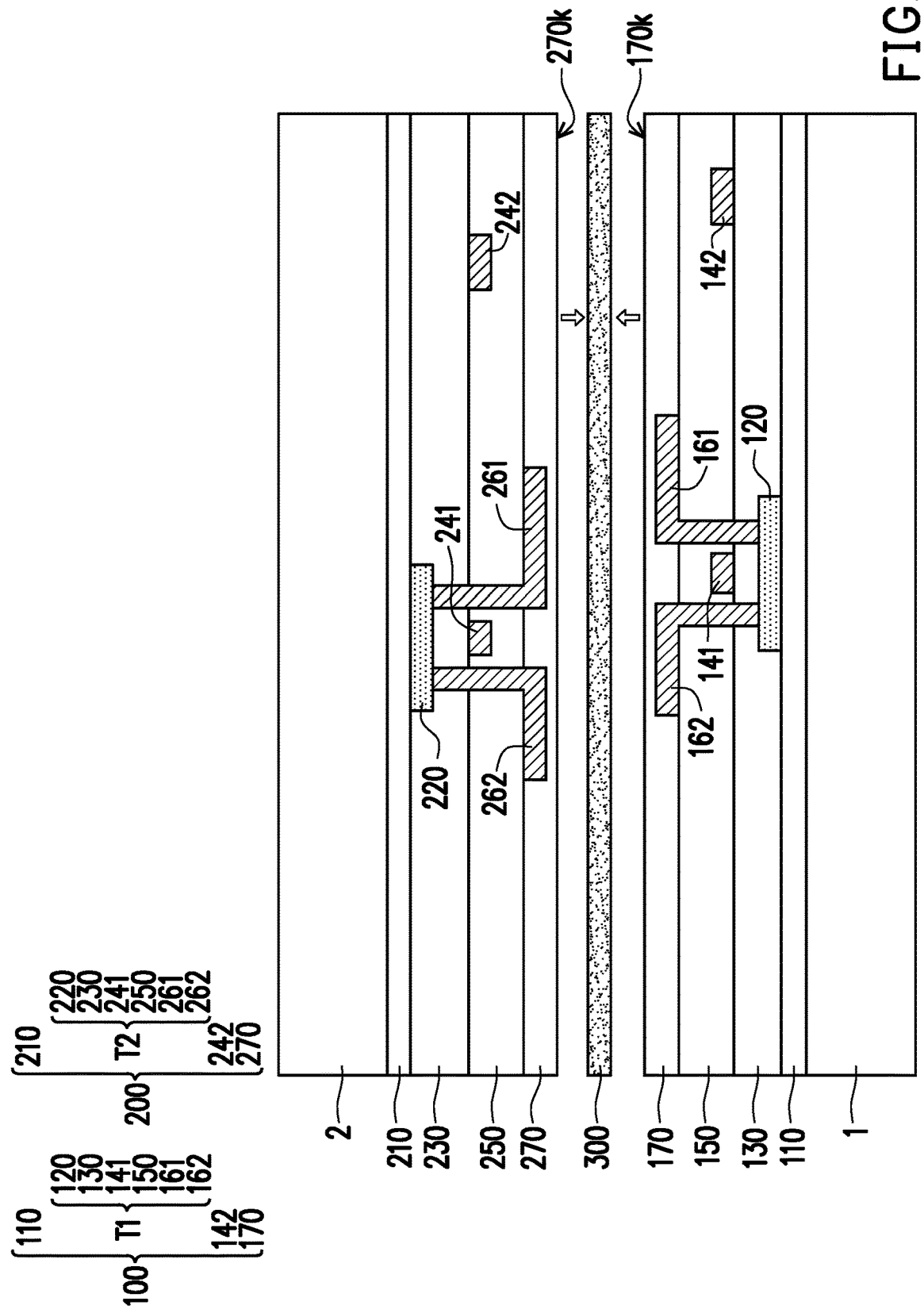

Demonstrating embodiments of the disclosure are to be referred in details. Examples of the demonstrating embodiments are explained in the drawings. Whenever possible, same reference numerals are used to represent same or similar parts in the drawings and descriptions.

It should be understood that when elements such as a layer, a film, an area, or a substrate are described to be "on" or "connected to" another element, the element may be directly on another element or be connected to another element, or a middle element may also exist. On the contrary, when an element is described to be "directly on another element" or "directly connected to" another element, a middle element does not exist. As used in the present content, "connect" may mean physical and/or electrical connection. Moreover, "electrically connected to" or "coupled to" may mean that another element exists between the two elements.

"about", "similarly", "substantively" used in the present content includes the value and an average value within an acceptable deviation range of a specific value confirmed by persons skilled in the art. A specific number of errors related to a measurement (which is a limitation of a measurement system) as well as a discussed measurement are considered. For example, "about" may represent a range within one or a plurality of standard deviations of the value, or within ±30%, ±20%, ±10%, ±5%. Moreover, the "about", "similar and "substantively" used in the present content may choose a more acceptable deviation range and standard deviation according to an optical nature, an etching nature or other natures rather than choosing one standard deviation to adapt all natures.

Unless otherwise defined, all terms (including technical terms or scientific terms) used in the present content have same meanings understood by persons skilled in the art. It should be further understood that those terms defined in a dictionary that is usually used should be explained to have meanings consistent to the meanings they have when they are in a related technology and in the context of the disclosure; and would not be explained as meanings that are idealized or overly formal unless the present content clearly defines so.

FIG. 1A-FIG. 1E are sectional schematic views of a manufacturing process of a display apparatus of a first embodiment of the disclosure.

Please refer to FIG. 1A. Firstly, a first circuit substrate and a second circuit substrate are provided. The first circuit substrate includes a substrate 1 and a first circuit layer 100 disposed on the substrate 1. The second circuit substrate includes a substrate 2 and a second circuit layer 200 disposed on the substrate 2.

In the present embodiment, the first circuit layer 100 may include a thin-film transistor T1. The thin-film transistor T1 includes a semiconductor pattern 120, an insulating sublayer 130, a gate 141, a first electrode 161 and a second electrode 162. The insulating sublayer 130 is disposed between the gate 141 and the semiconductor pattern 120. A first electrode 161 and a second electrode 162 are electrically connected to two different areas of the semiconductor pattern 120 respectively.

In the present embodiment, the thin-film transistor T1 may further optionally include an insulating sublayer 150. The insulating sublayer 150 is disposed on the insulating sublayer 130, and the first electrode 161 and the second electrode 162 may be disposed on the insulating sublayer 150, but the disclosure is not limited herein.

In the present embodiment, the first circuit layer 100 may further optionally include a buffering sublayer 110 and an insulating sublayer 170. The buffering sublayer 110 is disposed on the substrate 1, and the thin-film transistor T1 is disposed on the buffering sublayer 110, and the insulating sublayer 170 is disposed on the thin-film transistor T1, but the disclosure is not limited herein.

Besides, in the present embodiment, the first circuit layer 100 may further optionally include a bus line 142. The thin-film transistor T1 of the first circuit layer 100 is electrically connected to the bus line 142 of the first circuit layer 100. For example, in the present embodiment, the bus line 142 may form in a same film layer with the gate 141. However, the disclosure is not limited herein. According to other embodiments, the bus line 142 may form in a same film layer with the first electrode 161 and/or the second electrode 162.

Similarly, in the present embodiment, the second circuit layer 200 may include a thin-film transistor T2. The thin-film transistor T2 includes a semiconductor pattern 220, an insulating sublayer 230, a gate 241, a first electrode 261 and a second electrode 262. The insulating sublayer 230 is disposed between the gate 241 and the semiconductor pattern 220. The first electrode 261 and the second electrode 262 are electrically connected to two different areas of the semiconductor 220 respectively.

In the present embodiment, the thin-film transistor T2 may further optionally include an insulating sublayer 250. The insulating sublayer 250 is disposed on the insulating sublayer 230, and the first electrode 261 and the second electrode 262 may be disposed on the insulating sublayer 250, but the disclosure is not limited herein.

In the present embodiment, the second circuit layer 200 may further optionally include a buffering sublayer 210 and an insulating sublayer 270. The buffering sublayer 210 is disposed on the substrate 2, and the thin-film transistor T2 is disposed on the buffering sublayer 210, and the insulating sublayer 270 is disposed on the thin-film transistor T2, but the disclosure is not limited herein.

Besides, in the present embodiment, the second circuit layer 200 may further optionally include a bus line 242. The thin-film transistor T2 of the second circuit layer 200 is electrically connected to the bus line 242 of the second circuit layer 200. For example, in the present embodiment, the bus line 242 may form in a same film layer with the gate 241. However, the disclosure is not limited herein. According to other embodiments, the bus line 242 may form in a same film layer with the first electrode 261 and/or the second electrode 262.

In the present embodiment, based on a consideration for conductivity, the first electrodes 161 and 261, the second electrodes 162 and 262, the gates 141 and 241 and the bus lines 142 and 242 of the first circuit layer 100 and the second circuit layer 200 generally use metal materials, but the disclosure is not limited herein. According to other embodiments, the first electrodes 161 and 261, the second electrodes 162 and 262, the gates 141 and 241 and the bus lines 142 and 242 of the first circuit layer 100 and the second circuit layer 200 may use other conductive materials such as alloy, nitrides of metal materials, oxides of metal materials, oxynitrides of metal materials, or stack layers of metal materials with other conductive materials.

In the present embodiment, the buffering sublayers 110 and 210 and the insulating sublayers 130, 150, 170, 230, 250 and 270 of the first circuit layer 100 and the second circuit layer 200 may be inorganic materials (such as silicon dioxide, silicon nitride, silicon oxynitride, or a stack layer of the at least two materials), organic materials or combinations thereof.

Figure 1B:
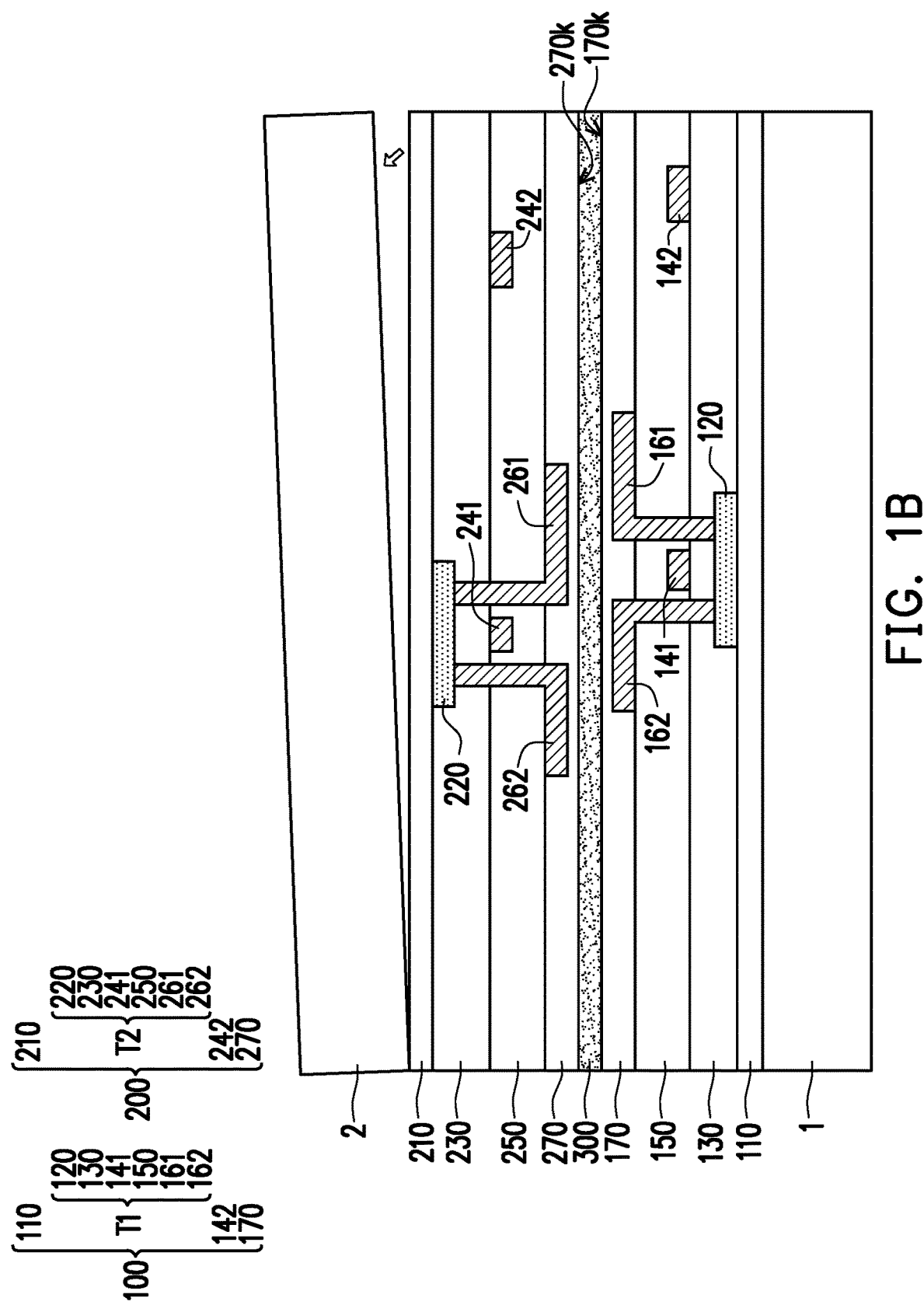

Please refer to FIG. 1A and FIG. 1B. Further, a bonding process is performed, which means using a first adhesive layer 300 to connect the first circuit substrate and the second circuit substrate. After the first circuit substrate and the second circuit substrate are connected, the first adhesive layer 300 is disposed on the first circuit layer 100, and the second circuit layer 200 is disposed on the first adhesive layer 300. In the present embodiment, the first adhesive layer 300 is an insulating adhesive layer.

The insulating sublayer 170 of the first circuit layer 100 has a surface 170k facing away from the semiconductor pattern 120. The insulating sublayer 270 of the second circuit payer 200 has a surface 270k facing away from the semiconductor pattern 220. For example, in the present embodiment, after the first circuit substrate and the second circuit substrate are connected, the surface 170k of the first circuit layer 100 facing away from the semiconductor pattern 120 may optionally face upward, and the surface 270k of the second circuit layer 200 facing away from the semiconductor pattern 220 may optionally face downward, but the disclosure is not limited herein.

Please refer to FIG. 1B. Further, the substrate 2 of the second circuit substrate is removed, and the second circuit layer 200 of the second circuit substrate is left on the first adhesive layer 300.

Please refer to FIG. 1C. Further, using a patterning process for at least one time to form vias 210a, 210b, 210c, 210d and 210e of the buffering sublayer 210, vias 230a, 230b, 230c, 230d, and 230e of the insulating sublayer 230, vias 250a, 250b, 250c, and 250d of the insulating sublayer 250, vias 270a and 270d of the insulating sublayer 270, vias 300a and 300d of the first adhesive layer 300, vias 170a and 170d of the insulating sublayer 170, and a via 150d of the insulating sublayer 150.

For example, in the present embodiment, the patterning process may include production processes such as photoresist coating, photoresist exposure and development, etching and photoresist removal.

In the present embodiment, a same patterning photoresist may be used as a cover, etching the buffering sublayer 210, the insulating sublayer 230, the insulating sublayer 250, the insulating sublayer 270, the first adhesive layer 300, the insulating sublayer 170 and the insulating sublayer 150. The via 210a of the buffering sublayer 210, the via 230a of the insulating sublayer 230, the via 250a of the insulating sublayer 250, the via 270a of the insulating sublayer 270, the via 300a of the first adhesive layer 300, and the via 170a of the insulating sublayer 170 may be aligned substantively. The via 210d of the buffering sublayer 210, the via 230d of the insulating sublayer 230, the via 250d of the insulating sublayer 250, the via 270d of the insulating sublayer 270, the via 300d of the first adhesive layer 300, the via 170d of the insulating sublayer 170 and the via 150d of the insulating sublayer 150 may be substantively aligned.

In the present embodiment, the via 210a of the buffering sublayer 210, the via 230a of the insulating sublayer 230, the via 250a of the insulating sublayer 250, the via 270a of the insulating sublayer 270, the via 300a of the first adhesive layer 300, the via 170a of the insulating sublayer 170 and a part of the thin-film transistor T1 (for example but not limited to: the first electrode 161) may define a groove U1. The groove U1 is located outside of the semiconductor pattern 220 of the thin-film transistor T2. In other words, the groove U1 does not overlap the semiconductor pattern 220 of the thin-film transistor T2.

In the present embodiment, the via 210b of the buffering sublayer 210, the via 230b of the insulating sublayer 230, the via 250b of the insulating sublayer 250 and a part of the thin-film transistor T2 (for example but not limited to: the first electrode 261) may define a groove U2. The groove U2 is located outside of the semiconductor pattern 220 of the thin-film transistor T2. In other words, the groove U2 does not overlap the semiconductor pattern 220 of the thin-film transistor T2.

In the present embodiment, the via 210c of the buffering sublayer 210, the via 230c of the insulating sublayer 230, the via 250c of the insulating sublayer 250 and a part of the thin-film transistor T2 (for example: the second electrode 262) may define a groove U3. The groove U3 is located outside of the semiconductor pattern 220 of the thin-film transistor T2. In other words, the groove U3 does not overlap the semiconductor pattern 220 of the thin-film transistor T2.

In the present embodiment, the via 210d of the buffering sublayer 210, the via 230d of the insulating sublayer 230, the via 250d of the insulating sublayer 250, the via 270d of the insulating sublayer 270, the via 300d of the first adhesive layer 300, the via 170d of the insulating sublayer 170, the via 150d of the insulating sublayer 150, and the bus line 142 may define a groove U4. The groove U4 is located outside of the semiconductor pattern 220 of the thin-film transistor T2 and the semiconductor pattern 120 of the thin-film transistor T1. In other words, the groove U4 does not overlap the semiconductor pattern 220 of the thin-film transistor T2 and the semiconductor pattern 120 of the thin-film transistor T1.

In the present embodiment, the via 210e of the buffering sublayer 210, the via 230e of the insulating sublayer 230 and the bus line 242 may define a groove U5. The groove U5 is located outside of the semiconductor pattern 220 of the thin-film transistor T2. In other words, the groove U5 does not overlap the semiconductor pattern 220 of the thin-film transistor T2.

Please refer to FIG. 1D. Further, a first conductive element 411, a second conductive element 412 and a pixel electrode 510 are formed on the second circuit layer 200.

The first conductive element 411 is disposed on the second circuit layer 200, and is electrically connected to the first circuit layer 100 and the second circuit layer 200. For example, in the present embodiment, the first conductive element 411 may be electrically connected to the thin-film transistor T1 of the first circuit layer 100 and the thin-film transistor T2 of the second circuit layer 200 through the vias 210a and 210b of the buffering sublayer 210, the vias 230a and 230b of the insulating sublayer 230, the vias 250a and 250b of the insulating sublayer 250, the via 270a of the insulating sublayer 270, the via 300a of the first adhesive layer 300 and the via 170a of the insulating sublayer 170.

The second conductive element 412 is disposed on the second circuit layer 200. The second conductive element 412 is electrically connected to the bus line 142 of the first circuit layer 100 and the bus line 242 of the second circuit layer 200 through the vias 210d and 210e of the buffering sublayer 210, the vias 230d and 230e of the insulating sublayer 230, the via 250d of the insulating sublayer 250, the via 270d of the insulating sublayer 270, the via 300d of the first adhesive layer 300, the via 170d of the insulating sublayer 170, and the via 150d of the insulating sublayer 150.

The pixel electrode 510 is disposed on the second circuit layer 200, and is electrically connected to the second circuit layer 200. For example, in the present embodiment, the pixel electrode 510 is electrically connected to the thin-film transistor T2 of the second circuit layer 200 through the via 210c of the buffering sublayer 210, the via 230c of the insulating sublayer 230, the via 250c of the insulating sublayer 250.

In the present embodiment, a sputtering production process may be used to form the first conductive element 411, the second conductive element 412 and the pixel electrode 250.

Therefore, a part of the first conductive element 411 may be conformally disposed in the groove U1 defined by the via 210a of the buffering sublayer 210, the via 230a of the insulating sublayer 230, the via 250a of the insulating sublayer 250, the via 270a of the insulating sublayer 270, the via 300a of the first adhesive layer 300, the via 170a of the insulating sublayer 170 and a part of the thin-film transistor T1 (for example but not limited to: the first electrode 161).

Another part of the first conductive element 411 may be conformally disposed in the groove U2 defined by the via 210b of the buffering sublayer 210, the via 230b of the insulating sublayer 230, the via 250b of the insulating sublayer 250 and a part of the thin-film-transistor T2 (for example but not limited to: the first electrode 261).

A part of the second conductive element 412 may be conformally disposed in the groove U4 defined by the via 210d of the buffering sublayer 210, the via 230d of the insulating sublayer 230, the via 250d of the insulating sublayer 250, the via 270d of the insulating sublayer 270, the via 300d of the first adhesive layer 300, the via 170d of the insulating sublayer 170, the via 150d of the insulating sublayer 150 and the bus line 142.

Another part of the second conductive element 412 may be conformally disposed in the groove U5 defined by the via 210e of the buffering sublayer 210, the via 230e of the insulating sublayer 230 and the bus line 242.

A part of the pixel electrode 510 may be conformally disposed in the groove U3 defined by the via 210c of the buffering sublayer 210, the via 230c of the insulating sublayer 230, the via 250c of the insulating sublayer 250 and a part of the thin-film transistor T2 (for example: the second electrode 262).

Figure 1E:
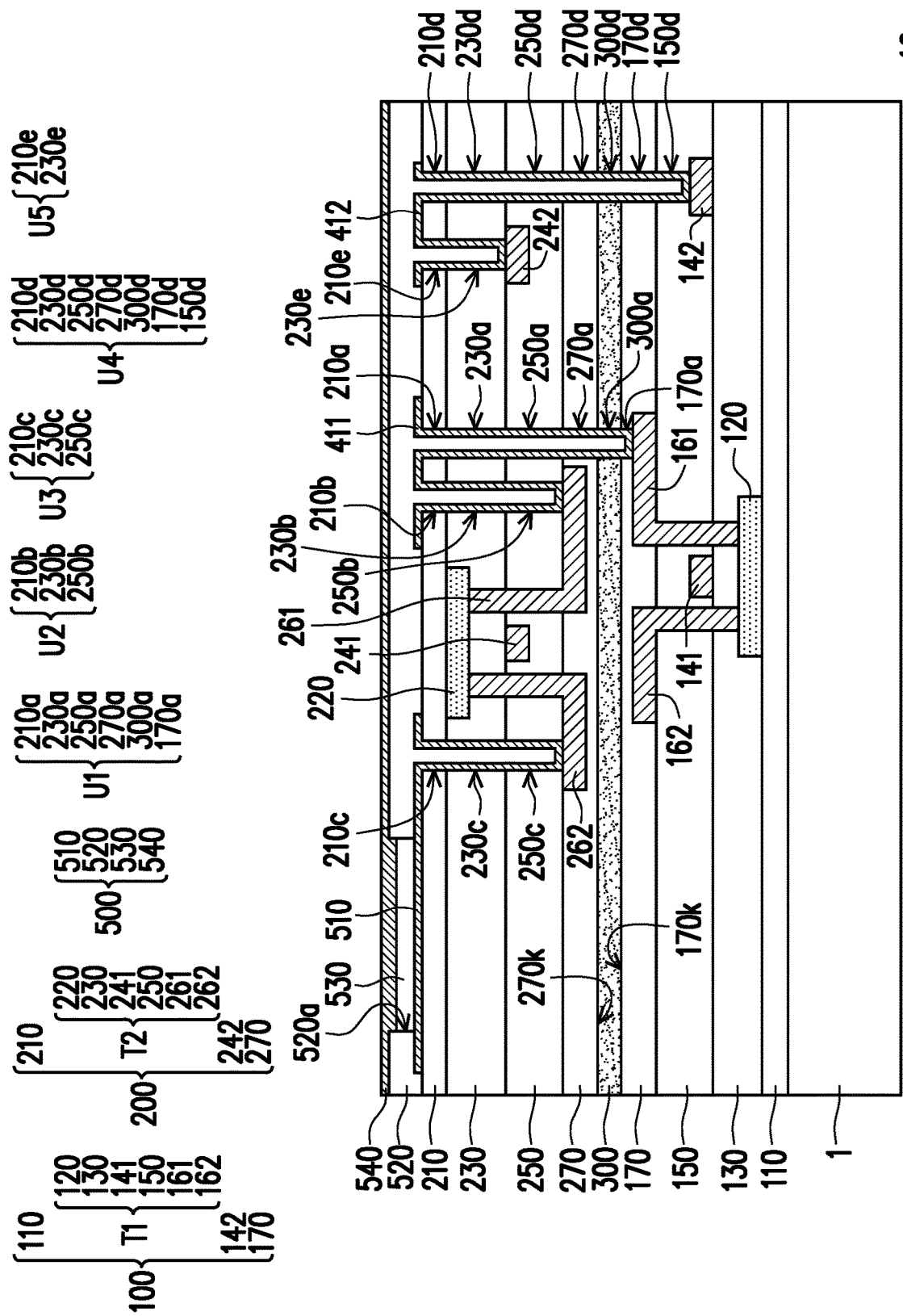

Please refer to FIG. 1E. Further, a pixel defining sublayer 520 is formed on the pixel electrode 510 and the second circuit layer 200. The pixel defining sublayer 520 is disposed on the pixel electrode 510, and has a via 520a overlapping the pixel electrode 510. Further, an organic electroluminescent material 530 is formed, and is disposed in the via 520a of the pixel defining sublayer 520. Then, a common electrode 540 is formed, and is disposed on the organic electroluminescent material 530. In the present embodiment, a display element layer 500 includes the pixel electrode 510, the pixel defining sublayer 520, the organic electroluminescent material 530 and the common electrode 540. Thus, a display apparatus 10 of the present embodiment is completed.

In the present embodiment, a part of the first conductive element 411 used to electrically connect the first circuit layer 100 and the second circuit layer 200 is disposed between the pixel defining sublayer 520 and the second circuit layer 200 (for example: the insulating sublayer 230 of the second circuit layer 200). A part of the second conductive element 412 used to electrically connect the first circuit layer 100 and the second circuit layer 200 is disposed between the pixel defining sublayer 520 and the second circuit layer 200 (for example: the second circuit layer 200 and the insulating sublayer 230).

It is worth noting that, in the present embodiment, the first conductive element 411 and the second conductive element 412 used to electrically connect the first circuit layer 100 and the second circuit layer 200 are formed on the second circuit layer 200, inside the second circuit layer 200 and inside the first circuit layer 100 after the first circuit layer 100 and the second circuit layer 200 are bonded. Therefore, even though the bonding precision of the first circuit layer 100 and the second circuit layer 200 is not high, the first circuit layer 100 and the second circuit layer 200 may still be electrically connected to each other using the first conductive element 411 and the second conductive element 412 formed after the bonding process, so as to greatly decrease the manufacturing difficulty of the display apparatus 10.

It should be explained herein that following embodiments use reference numerals and parts of the content of the aforementioned embodiments, wherein same reference numerals are adopted to represent same or similar elements, and explanation of same technical contents are omitted. Regarding the omitted parts of the explanation, please refer to the aforementioned embodiments, and the following embodiments would not describe the same content again.

Figure 2:
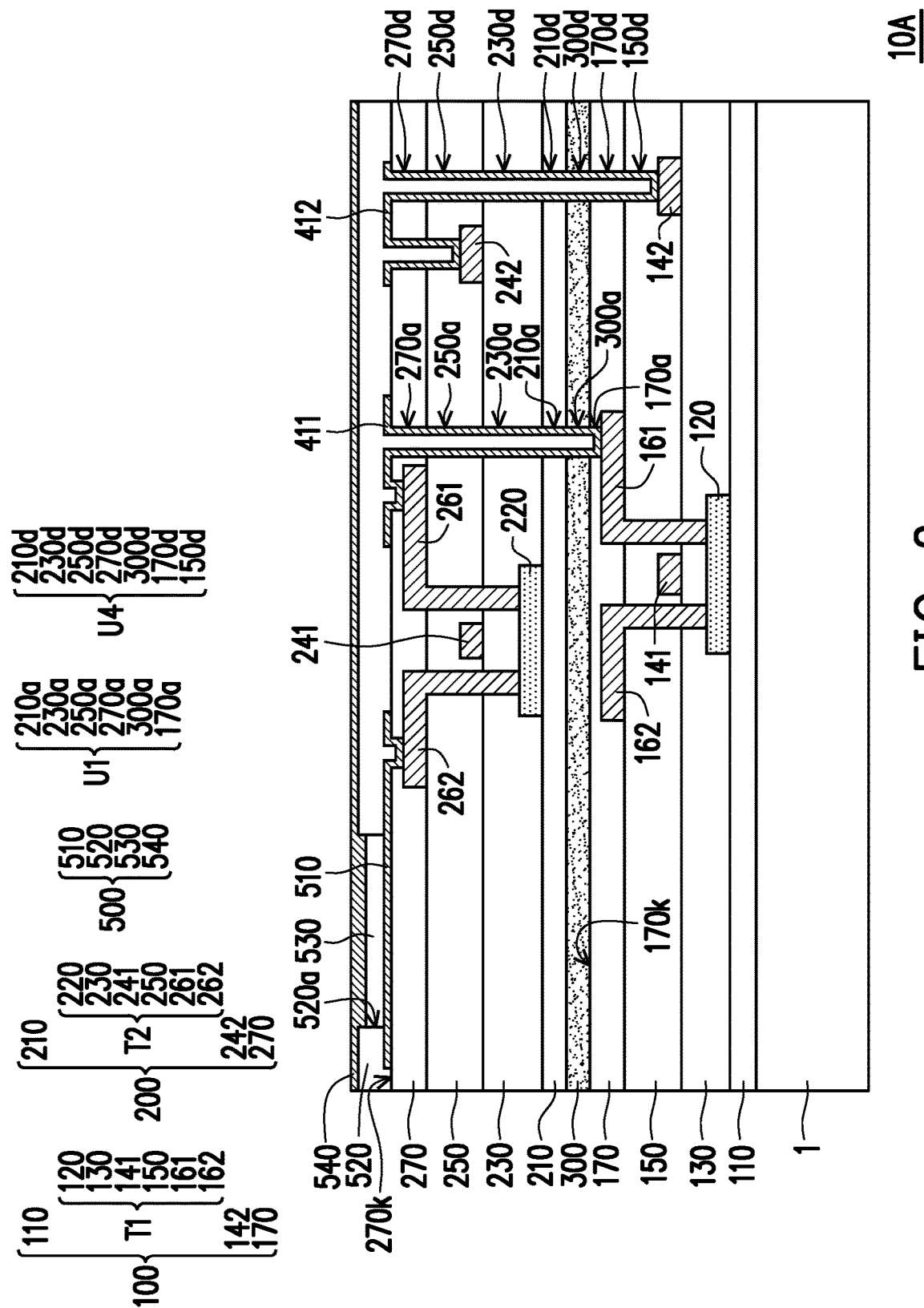
FIG. 2 is a sectional schematic view of a display apparatus of a second embodiment of the disclosure.

FIG. 2 is a sectional schematic view of a display apparatus of a second embodiment of the disclosure. A display apparatus 10A of FIG. 2 is similar to the display apparatus 10 of FIG. 1E. The difference of the two apparatuses lies in that the surface 170k of the first circuit layer 100 of the display apparatus 10A and the surface 270k of the second circuit layer 200 of the display apparatus 10A both face upward.

Figure 3:
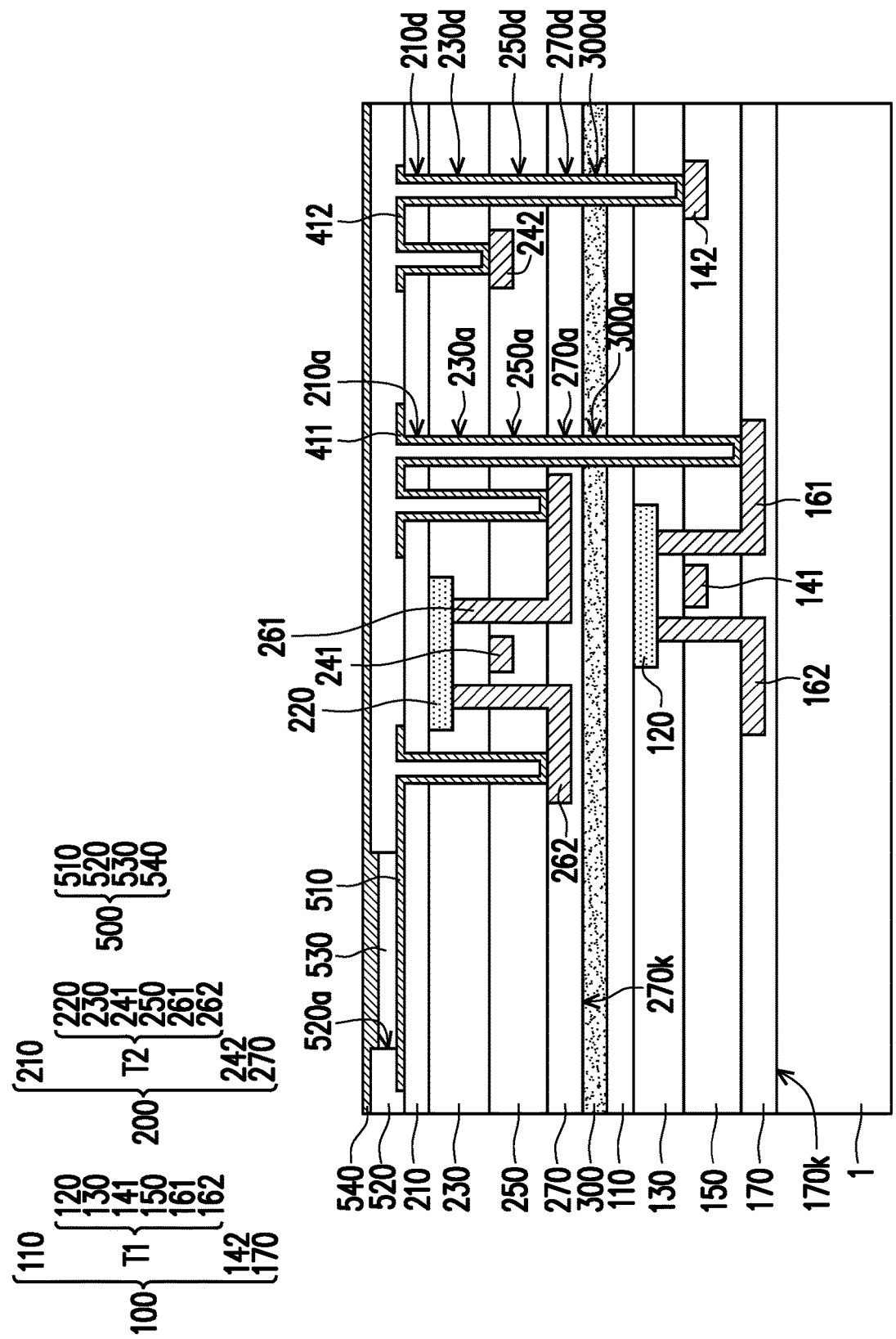
FIG. 3 is a sectional schematic view of a display apparatus of a third embodiment of the disclosure.

FIG. 3 is a sectional schematic view of a display apparatus of a third embodiment of the disclosure. A display apparatus 10B of FIG. 3 is similar to the display apparatus 10 of FIG. 1E. The difference of the two apparatuses lies in that the surface 170k of the insulating sublayer 170 of the first circuit layer 100 of the display apparatus 10B and the surface 270k of the insulating sublayer 270 of the second circuit layer 200 of the display apparatus 10B both face downward.

Figure 4:
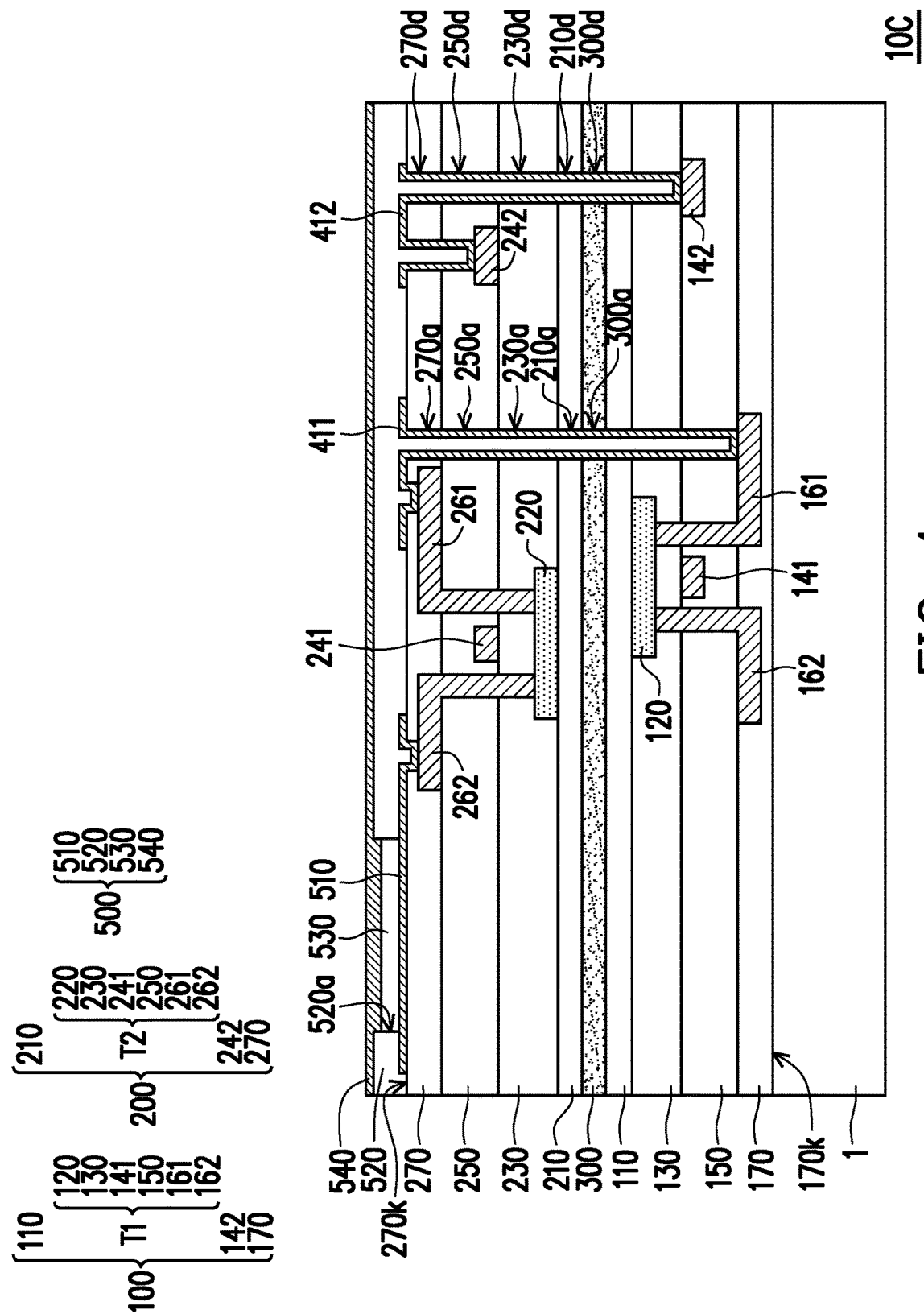
FIG. 4 is a sectional schematic view of a display apparatus of a fourth embodiment of the disclosure.

FIG. 4 is a sectional schematic view of a display apparatus of a fourth embodiment of the disclosure. A display apparatus 10C of FIG. 4 is similar to the display 10 of FIG. 1E. The difference of the two apparatuses lies in that the surface 170k of the first circuit layer 100 of the display apparatus 10C faces downward and the surface 270k of the second circuit layer 200 of the display apparatus 10C faces upward.

Figure 5:
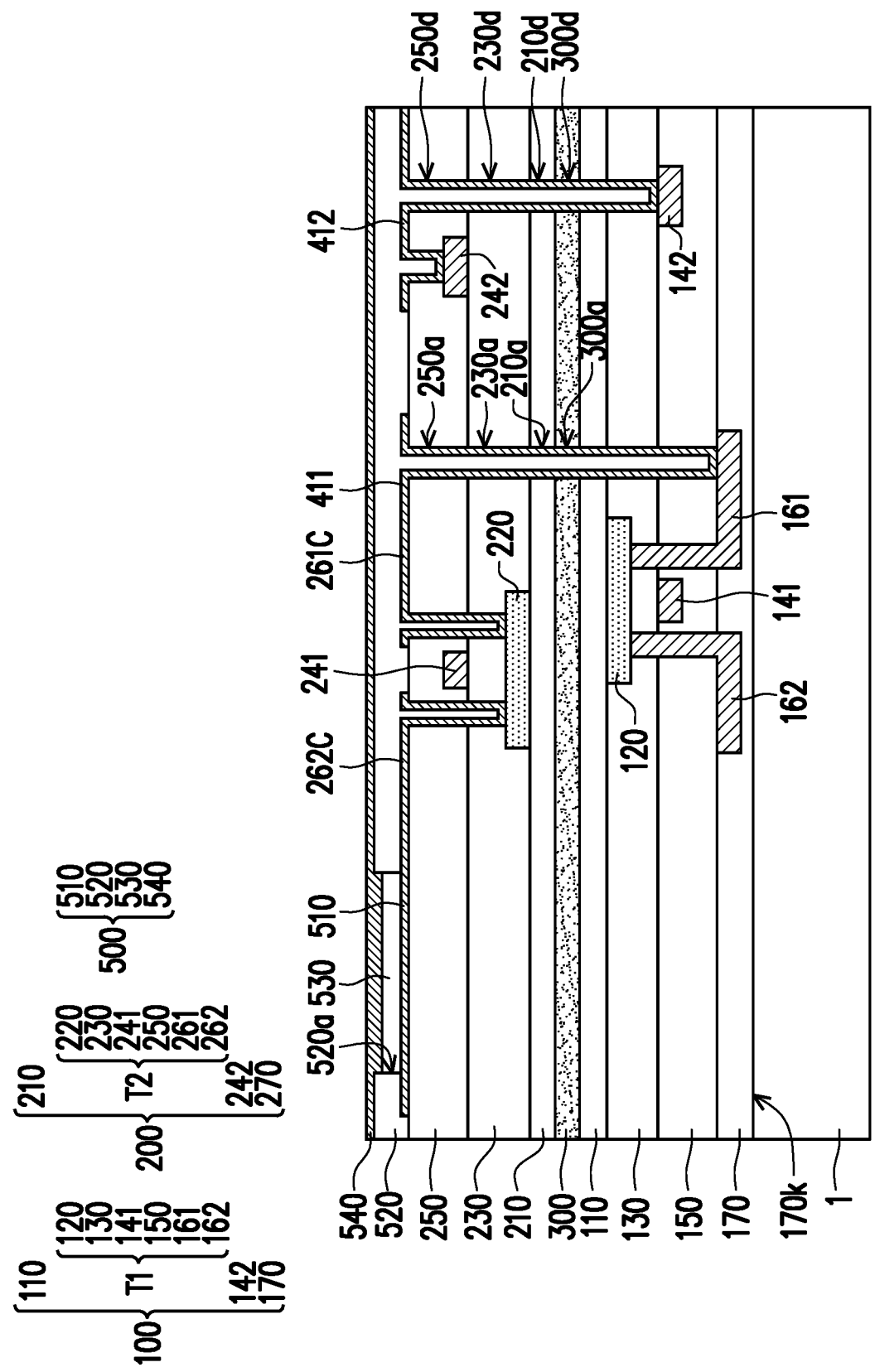
FIG. 5 is a sectional schematic view of a display apparatus of a fifth embodiment of the disclosure.

FIG. 5 is a sectional schematic view of a display apparatus of a fifth embodiment of the disclosure. A display apparatus 10D of FIG. 5 is similar to the display 10C of FIG. 4. The difference of the two apparatuses lies as follows. Please refer to FIG. 5. In the present embodiment, a first electrode 261C and a second electrode 262C of the thin-film transistor T2 form in a same film layer with at least one part of the first conductive element 411. In other words, the first electrode 261C and the second electrode 262C of the thin-film transistor T2 and the first conductive element 411 may be manufactured together. Therefore, compared to the display apparatus 10C of FIG. 4, the display apparatus 10D of FIG. 5 further has advantages of simplifying manufacturing process and reducing manufacturing costs.

Figure 6:
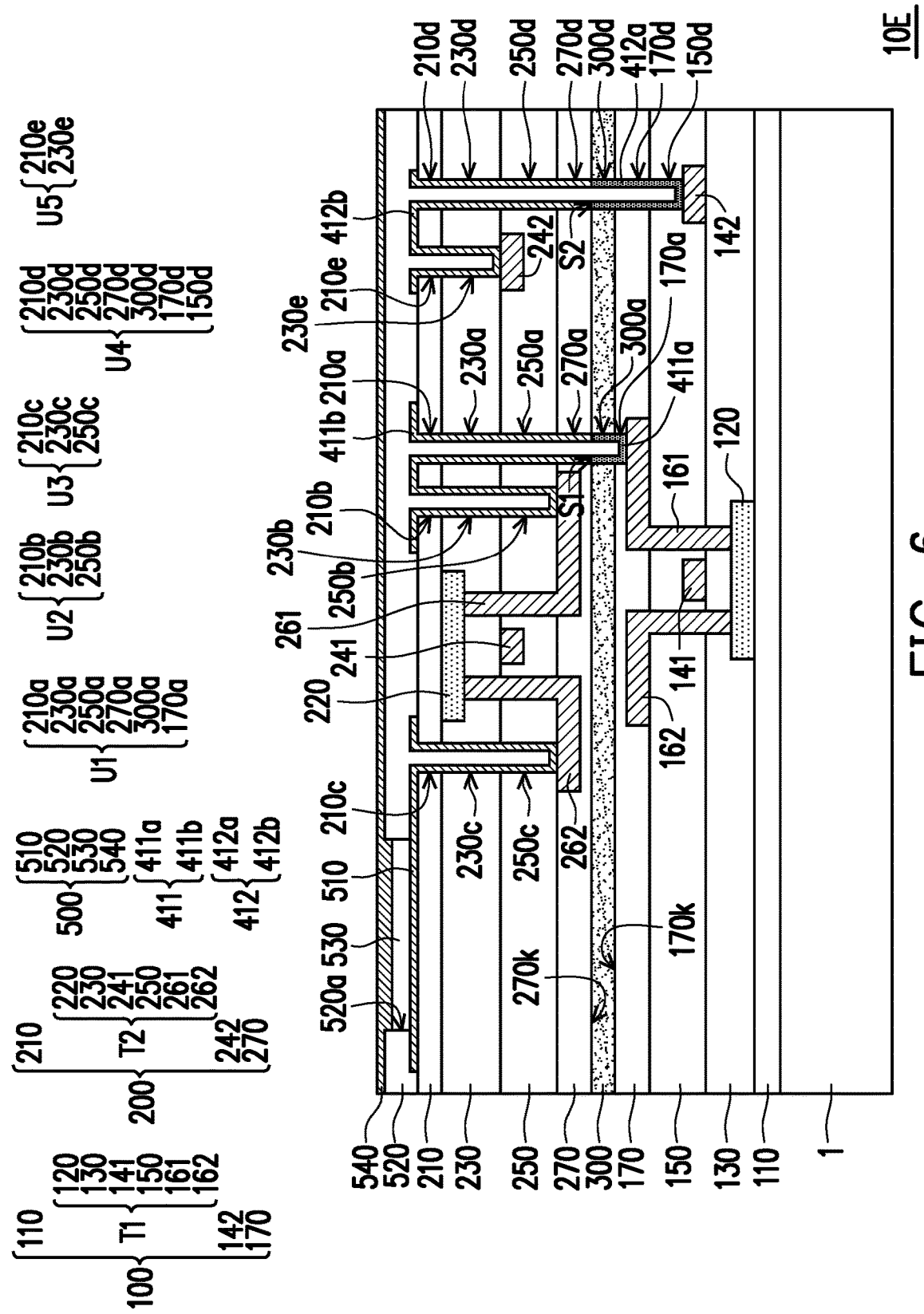
FIG. 6 is a sectional schematic view of a display apparatus of a sixth embodiment of the disclosure.

FIG. 6 is a sectional schematic view of a display apparatus of a sixth embodiment of the disclosure. A display apparatus 10E of FIG. 6 is similar to the display apparatus 10D of FIG. 1E. The difference of the two apparatuses lies as follows.

Please refer to FIG. 6. In a manufacturing process of the display apparatus 10E, the first adhesive layer 300 may be formed in advance on the first circuit layer 100; then, before the second circuit layer 200 bonds with the first circuit layer 100, the vias 300a and 300d of the first adhesive layer 300, the vias 170a and 170d of the insulating sublayer 170 of the first circuit layer 100, and the via 150d of the insulating sublayer 150 of the first circuit layer 100 are formed, and a first portion 411a is formed in advance in the vias 170a and 300a, forming a first portion 412a in the vias 300d, 170d and 150d; further, the second circuit layer 200 and the first circuit layer 100 are then bonded; further, the vias 210a and 210d of the insulating sublayer 210, the vias 230a and 230d of the insulating sublayer 230, the vias 250a and 250d of the insulating sublayer 250 and the vias 270a and 270d of the insulating sublayer 270 are formed; further, a second portion 411b are formed in the vias 210a, 230a, 250a and 270a, and a second portion 412b are formed in the vias 210d, 230d, 250d and 270d, wherein the second portion 411b and the first portion 411a are connected as the first conductive element 411, and the second portion 412b and the first portion 412a are connected as the second conductive element 412.

Since the first portion 411a and the second portion 411b of the first conductive element 411 are formed in different manufacturing process, the first portion 411a and the second portion 411b of the first conductive element 411 has an interface S1. Similarly, since the first portion 412a and the second portion 412b of the second conductive element 412 are formed in different manufacturing processes, the first portion 412a and the second portion 412b of the second conductive element 412 has an interface S2.

The display element layer 500 is driven by a driving circuit, and the driving circuit may be composed of a plurality of circuit layers (such as the first circuit layer 100 and the second circuit layer 200) separated by at least one adhesive layer (such as the first adhesive layer 300).

For example, in the display apparatuses 10 and 10A-10E, the driving circuit used to drive the display element layer 500 may be a structure of 7 thin-film transistors and one capacitor (7T1C), and the thin-film transistor T1 of the first circuit layer and the thin-film transistor T2 of the second circuit layer 200 may be two thin-film transistors of the first electrodes 161 and 261 of the 7T1C driving circuit electrically connected to each other.

However, the disclosure is not limited herein. According to other embodiments, the driving circuit used to drive the display element layer 500 may be other structures, and/or the thin-film transistor T1 of the first circuit layer 100 and the thin-film transistor T2 of the second circuit layer 200 may be electrically connected by other methods. Examples are raised with FIG. 7 in the following content.

Figure 7:
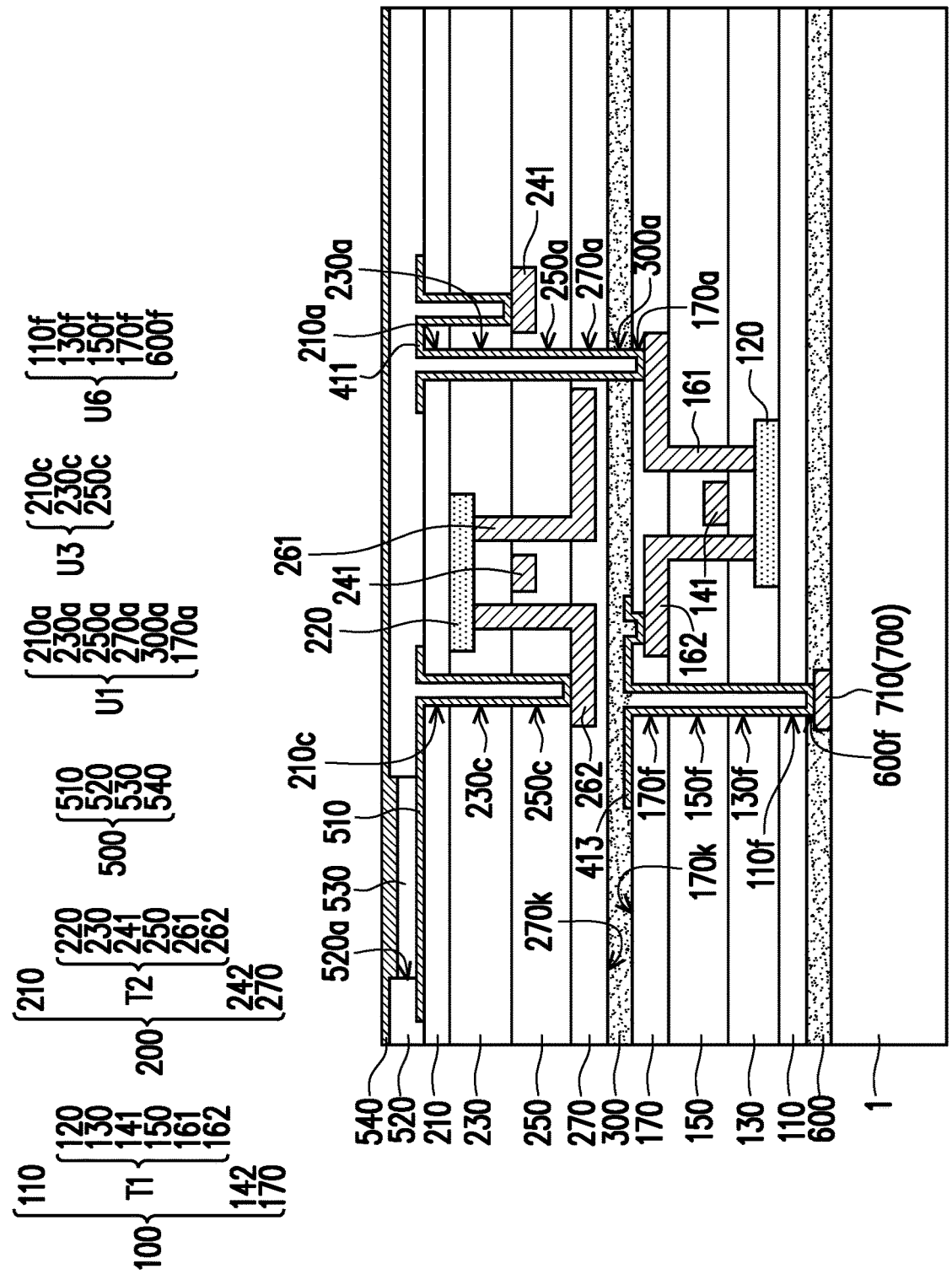
FIG. 7 is a sectional schematic view of a display apparatus of a seventh embodiment of the disclosure.

FIG. 7 is a sectional schematic view of a display apparatus of a seventh embodiment of the disclosure. The display apparatus 10F of FIG. 7 is similar to the display apparatus 10 of FIG. 1E, and the difference of the two apparatuses lies as follows.

Please refer to FIG. 7. For example, in the present embodiment, a driving circuit used to drive the display element layer 520 may be a structure of 2 thin-film transistors and one capacitor (2T1C). The thin-film transistor T1 of the first circuit layer 100 and the thin-film transistor T2 of the second circuit layer 200 may be respectively a switching TFT and a driving TFT of the 2T1C driving circuit, and the first electrode 161 of the thin-film transistor T1 of the first circuit layer 100 and the gate 241 of the thin-film transistor T2 of the second circuit layer 200 use the first conductive element 411 to be electrically connected to each other.

Besides, in the present embodiment, the display apparatus 10F further includes a second adhesive layer 600, a third element layer 700 and a third conductive element 413. The second adhesive layer 600 is disposed between the first circuit layer 100 and the substrate 1. The third element layer 700 includes a bus line 710. The bus line 710 is disposed between the second adhesive layer 600 and the substrate 1. The third conductive element 412 is disposed on the first circuit layer 100, and is electrically connected to the thin-film transistor T1 of the first circuit layer 100, wherein the third conductive element 413 is electrically connected to the bus line 710 of the third element layer 700 through a via 600f of the second adhesive layer 600.

For example, in the present embodiment, the insulating sublayer 170 has a via 170f disposed outside of the semiconductor pattern 120, the insulating sublayer 150 has a via 150f disposed outside of the semiconductor pattern 120, the insulating sublayer 130 has a via 130f disposed outside of the semiconductor pattern 120, and the buffering sublayer 110 has a via 110f disposed outside of the semiconductor pattern 120; and the third conductive element 413 may be electrically connected to the bus line 710 of the third element layer 700 through the via 170f of the insulating sublayer 170, the via 150f of the insulating sublayer 150, the via 130f of the insulating sublayer 130, the via 110f of the buffering sublayer 110 and the via 600f of the second adhesive layer 600. The via 170f of the insulating sublayer 170, the via 150f of the insulating sublayer 150, the via 130f of the insulating sublayer 130, the via 110f of the buffering sublayer 110 and the via 600f of the second adhesive layer 600 are substantively aligned, but the disclosure is not limited herein.

In the present embodiment, a groove U6 may be defined by the via 170f of the insulating sublayer 170, the via 150f of the insulating sublayer 150, the via 130f of the insulating sublayer 130, the via 110f of the buffering sublayer 110, the via 600f of the second adhesive layer 600 and the bus line 710. The groove U6 is disposed outside of the semiconductor pattern 120 of the first circuit layer 100, and a part of the third conductive element 412 may be conformally disposed in the groove U6.

FIG. 8A-FIG. 8D are sectional schematic views of a manufacturing process of a display apparatus of an eighth embodiment of the disclosure.

Figure 8A:
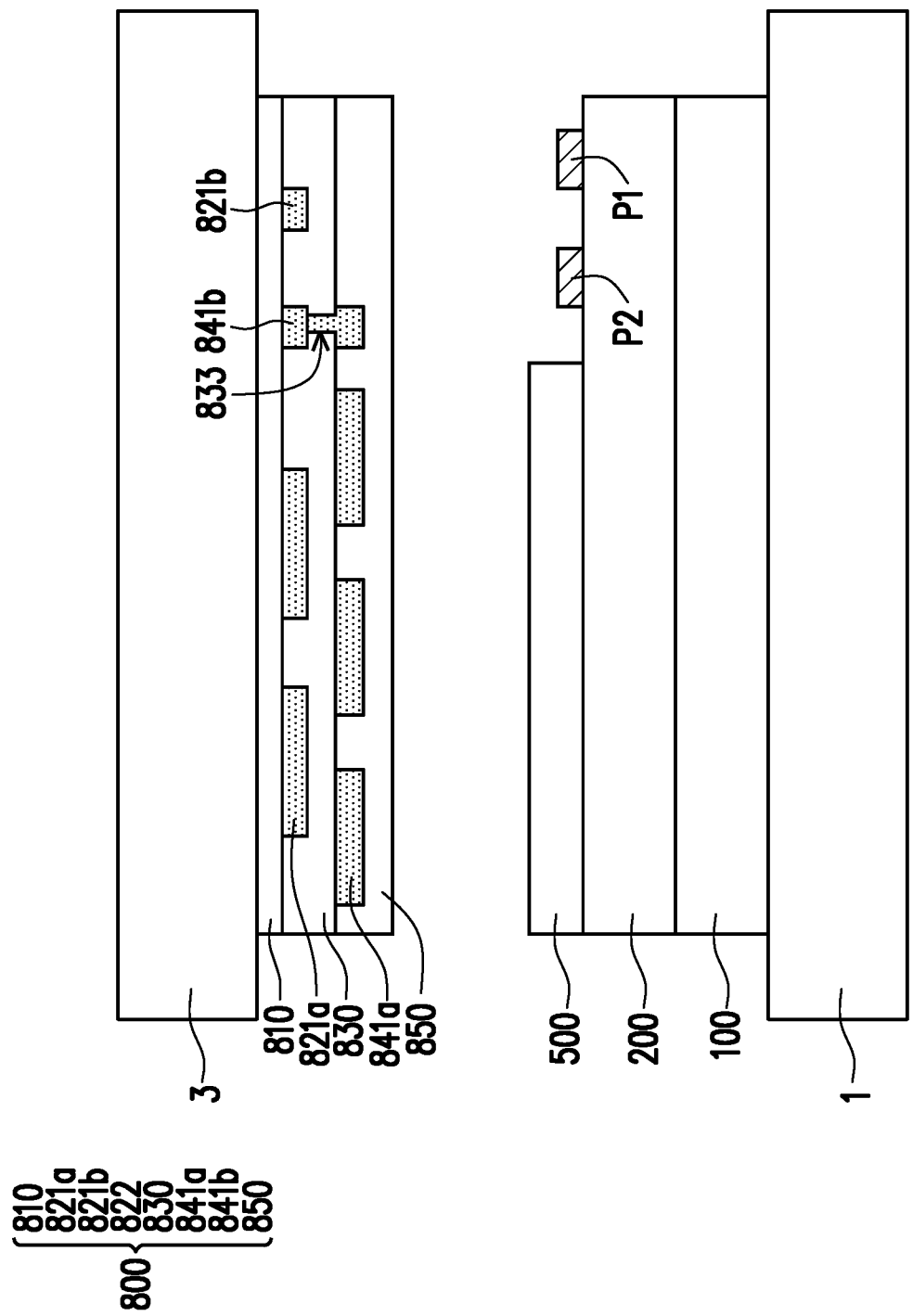
FIG. 8A-FIG. 8D are sectional schematic views of a manufacturing process of a display apparatus of an eighth embodiment of the disclosure.

Please refer to FIG. 8A. Firstly, a display substrate and a touch substrate is provided. The display substrate on a lower part of FIG. 8A includes the substrate 1, the first circuit layer 100, the second circuit layer 200 and the display element layer 500. The first circuit layer 100, the second circuit layer 200 and the display element layer 500 are schematically shown in FIG. 8A, and detailed structures are omitted. The touch substrate on an upper part of FIG. 8A includes a substrate 3 and a touch element layer 800 disposed on the substrate 3. The display substrate on a lower part of FIG. 8A further includes pads P1 and P2 disposed on the substrate 1. For example, the pads P1 and P2 are used for an assembling of a driving chip, so as to allowed the touch element layer 800 on an upper part of FIG. 8A to be driven by the driving chip.

It should be explained that, for clarity, in FIG. 8A, the pads P1 and P2 are shown to be disposed on the second circuit layer 200 as an example; however, the disclosure is not limited herein. According to other embodiments, the pads P1 and P2 may also be disposed to the first circuit layer 100, to the second circuit layer 200 or inside a combination thereof.

Please refer to FIG. 8A. For example, in the present embodiment, the touch element layer 800 may include a buffering sublayer 810, a sensing electrode 821a and peripheral wirings 821b and 841b disposed on the buffering sublayer 810, an insulating sublayer 830 disposed on the sensing electrode 821a and the peripheral wirings 821b and 841b, a sensing electrode 841a disposed on the insulating sublayer 830 and an insulating sublayer 850 disposed on the sensing electrode 841a. The sensing electrode 821a is electrically connected to the peripheral wiring 821b. The sensing electrode 841a may be electrically connected to the peripheral wiring 841b through a via 833 of the insulating sublayer 830.

Figure 8B:
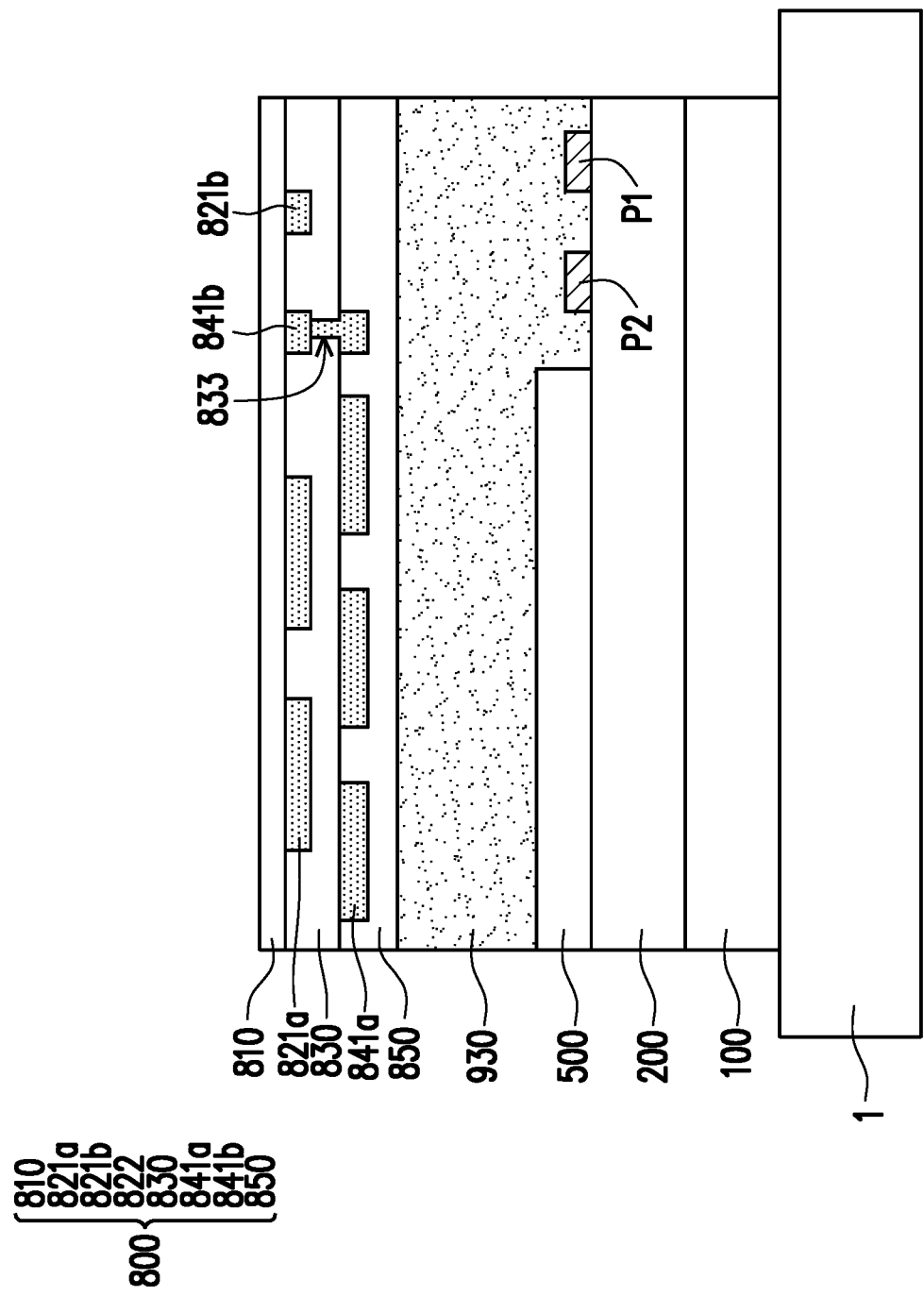

Please refer to FIG. 8A and FIG. 8B. Further, a bonding process is performed, which means a first adhesive layer 930 is used to connect the touch substrate and the display substrate. After the touch substrate and the display substrate are connected, the first adhesive layer 930 is disposed on the display element layer 500 and the pads P1 and P2, and the touch element layer 800 is disposed on the first adhesive layer 930. The insulating sublayers 830 and 850 are disposed between the sensing electrode 821a and the first adhesive layer 930 and between the peripheral wirings 841b and 821b and the first adhesive layer 930.

Please refer to FIG. 8A and FIG. 8B. The substrate 3 of the touch substrate is removed, and the touch element layer 800 is left on the first adhesive layer 930.

Figure 8C:
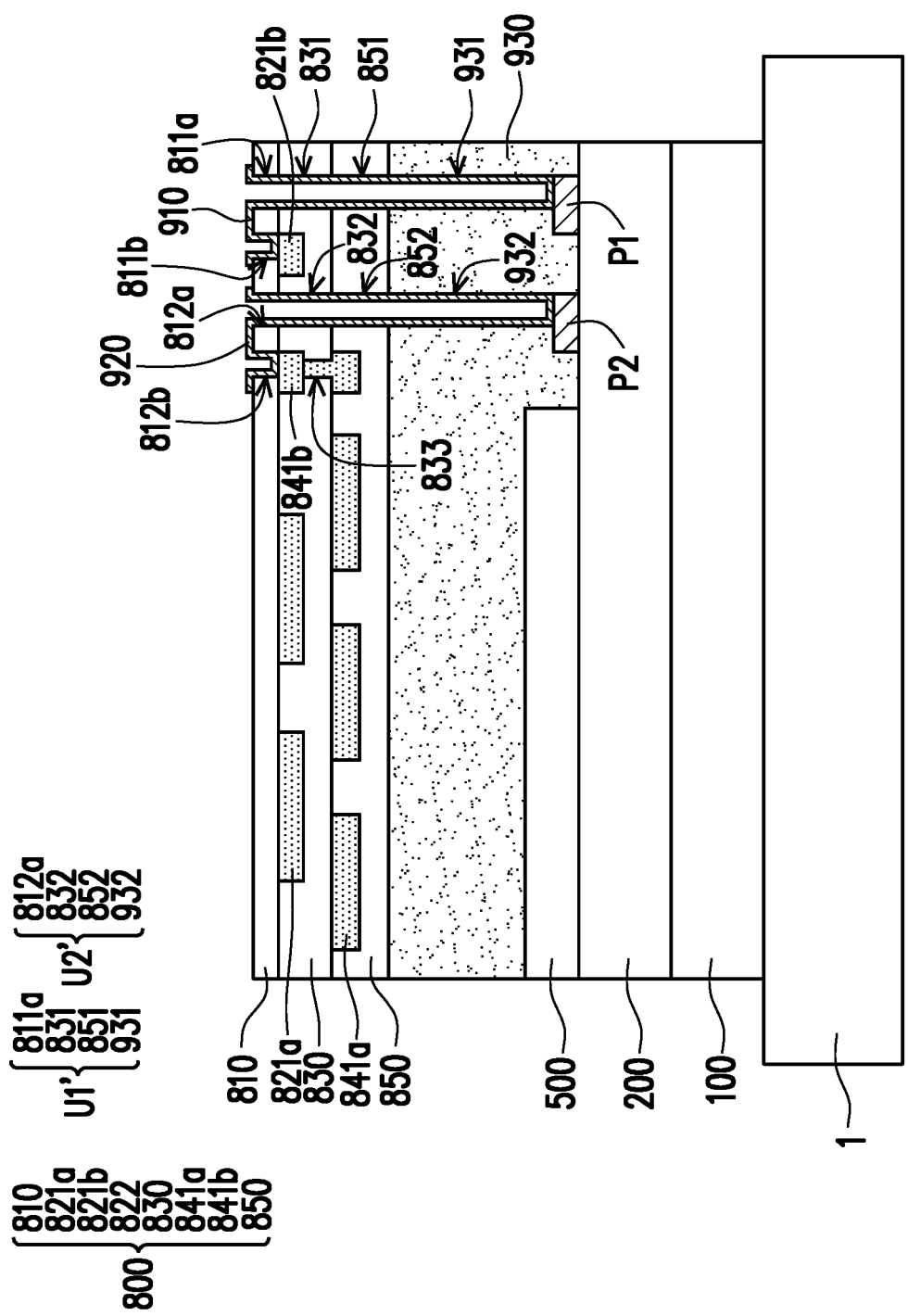

Please refer to FIG. 8C. Further, the vias 811a, 811b, 812a and 812b of the buffering sublayer 810, the vias 831 and 832 of the insulating sublayer 830, the vias 851 and 852 of the insulating sublayer 850 and the vias 931 and 932 of the first adhesive layer 930 are formed through using the patterning process for at least one time.

For example, in the present embodiment, the patterning process may include production processes such as photoresist coating, photoresist exposing and development, etching and photoresist removal.

In the present embodiment, a same patterning photoresist may be used as a cover, etching the buffering sublayer 810, the insulating sublayer 830, the insulating sublayer 850 and the first adhesive layer 930. The via 811a of the insulating sublayer 810, the via 831 of the insulating sublayer 830, the via 851 of the insulating sublayer 850 and the via 931 of the first adhesive sublayer 930 are substantively aligned. A groove U1' may be defined by the via 811a of the buffering sublayer 810, the via 831 of the insulating sublayer 830, the via 851 of the insulating sublayer 850, the via 931 of the first adhesive layer 930 and the pad P1. The via 812a of the buffering sublayer 810, the via 832 of the insulating sublayer 830, the via 852 of the insulating sublayer 850, and the via 932 of the first adhesive layer 930 may be substantively aligned. A groove U2' may be defined by the via 812a of the buffering sublayer 810, the via 832 of the insulating sublayer 830, the via 852 of the insulating sublayer 850, the via 932 of the first adhesive layer 930 and the pad P2.

Figure 8D:
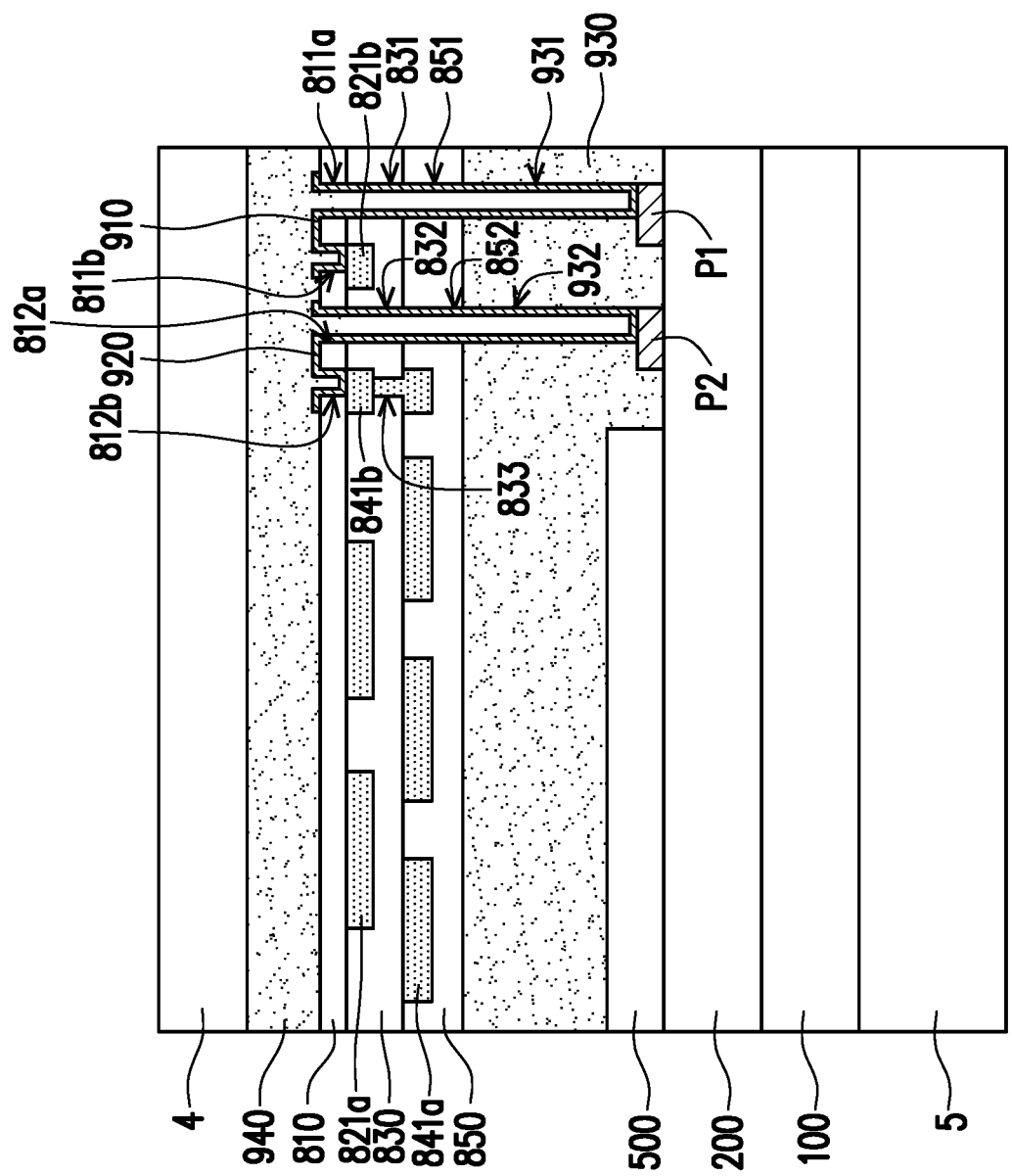

Please refer to FIG. 8D. Further, a conductive element 910 and a conductive element 920 are formed on the touch element layer 800.

The conductive elements 910 and 920 are disposed on the touch element layer 800, and are electrically connected to the touch element layer 800. For example, in the present embodiment, the conductive element 910 may be electrically connected to the peripheral wiring 821b through the via 811b of the buffering sublayer 810, and the conductive element 920 may be electrically connected to the peripheral wiring 841b through the via 812b of the buffering sublayer 810.

The conductive elements 910 and 920 are electrically connected to the pads P1 and P2 through the vias 931 and 932 of the first adhesive layer 930. For example, in the present embodiment, the conductive elements 910 and 920 may be electrically connected to the pad P1 through the via 811a of the buffering sublayer 810, the via 831 of the insulating sublayer 830, the via 851 of the insulating sublayer 850 and the via 931 of the first adhesive layer 930, and the conductive element 920 may be electrically connected to the pad P2 through the via 812a of the buffering sublayer 810, the via 832 of the insulating sublayer 830, the via 852 of the insulating sublayer 850 and the via 932 of the first adhesive layer 930.

In the present embodiment, a sputtering production process may be used to form the conductive elements 910 and 920. Therefore, a part of the conductive element 910 may be conformally disposed in a groove U1' defined by the via 811a of the buffering sublayer 810, the via 831 of the insulating sublayer 830, the via 851 of the insulating sublayer 850, the via 931 of the first adhesive layer 930 and the pad P1, and a part of the conductive element 920 may be conformally disposed in a groove U2' defined by the via 812a of the buffering sublayer 810, the via 832 of the insulating sublayer 830, the via 852 of the insulating sublayer 850, the via 932 of the first adhesive layer 930 and the pad P2.

Please refer to FIG. 8D. Further, a bonding process is performed, which means that a second adhesive layer 940 is used to connect a covering plate 4 and the touch element layer 800. After the covering plate 4 and the touch element layer 800 are bonded, the second adhesive layer 940 is disposed on the touch element layer 800, and a part of each of the conductive elements 910 and 920 is disposed between the second adhesive layer 940 and the touch element layer 800. The covering plate 4 is disposed on the second adhesive layer 940. Thus, a display apparatus 20 having a touch function of the present embodiment is completed.

In the present embodiment, the sensing electrode 821a and the peripheral wiring 821b are disposed between the insulating sublayer 830 and the buffering sublayer 810, the insulating sublayer 830 is disposed between the sensing electrode 821a and the first adhesive layer 930 and between the peripheral wiring 821b and the first adhesive layer 930, the buffering sublayer 810 is disposed between the sensing electrode 821a and the second adhesive layer 940 and between the peripheral wiring 821b and the second adhesive layer 940, the conductive element 910 is disposed on the buffering sublayer 810 and is electrically connected to the peripheral wiring 821b through the via 811b of the buffering sublayer 810.

Similarly, in the present embodiment, the sensing electrode 841a and the peripheral wiring 841b are disposed between the insulating sublayer 850 and the buffering sublayer 810, the insulating sublayer 850 is disposed between the sensing electrode 841a and the first adhesive layer 930 and between the peripheral wiring 841b and the first adhesive layer 930, the buffering sublayer 810 is disposed between the sensing electrode 841a and the second adhesive layer 940 and between the peripheral wiring 841b and the second adhesive layer 940, and the conductive element 920 is disposed on the buffering sublayer 810 and is electrically connected to the peripheral wiring 841b through the via 812b of the buffering sublayer 810.

It is worth noting that, in the present embodiment, the conductive elements 910 and 920 used to electrically connect the touch element layer 800 and the pads P1 and P2 are formed on the touch element layer 800, inside the touch element layer 800 and inside the first adhesive layer 930 after the bonding of the touch element layer 800 with the circuit layers 100 and 200 and the display element layer 500. The conductive elements 910 and 920 may electrically connect the touch element layer 800 and the pads P1 and P2 finely, and the bending tolerance of the conductive elements 910 and 920 is good.

It should be explained herein that following embodiments use reference numerals and parts of the content of the aforementioned embodiments, wherein same reference numerals are adopted to represent same or similar elements, and explanation of same technical contents are omitted. Regarding the omitted parts of the explanation, please refer to the aforementioned embodiments, and the following embodiments would not describe the same content again.

Figure 9:
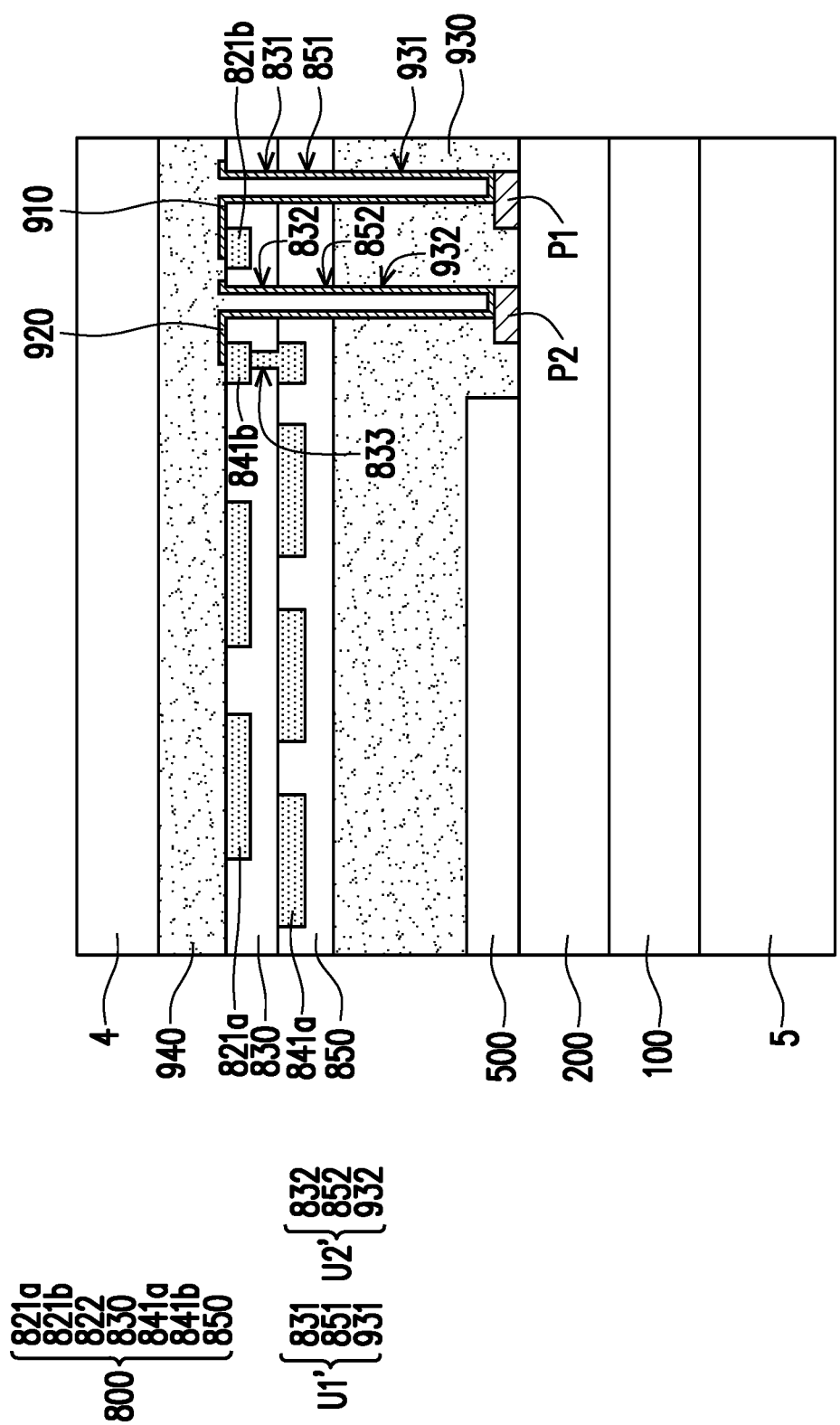
FIG. 9 is a sectional schematic view of a manufacturing process of a display apparatus of a ninth embodiment of the disclosure.

FIG. 9 is a sectional schematic view of a manufacturing process of a display apparatus of a ninth embodiment of the disclosure. A display apparatus 20A of FIG. 9 is similar to the display apparatus 20 of FIG. 8D. The difference of the two display apparatuses lies in that the display apparatus 20A of FIG. 9 may not include the buffering sublayer 810 of FIG. 8D, a part of the conductive element 910 of FIG. 9 may directly cover on the peripheral wiring 821b, and a part of the conductive element 920 of FIG. 9 may directly cover on the peripheral wiring 841b.

Figure 10:
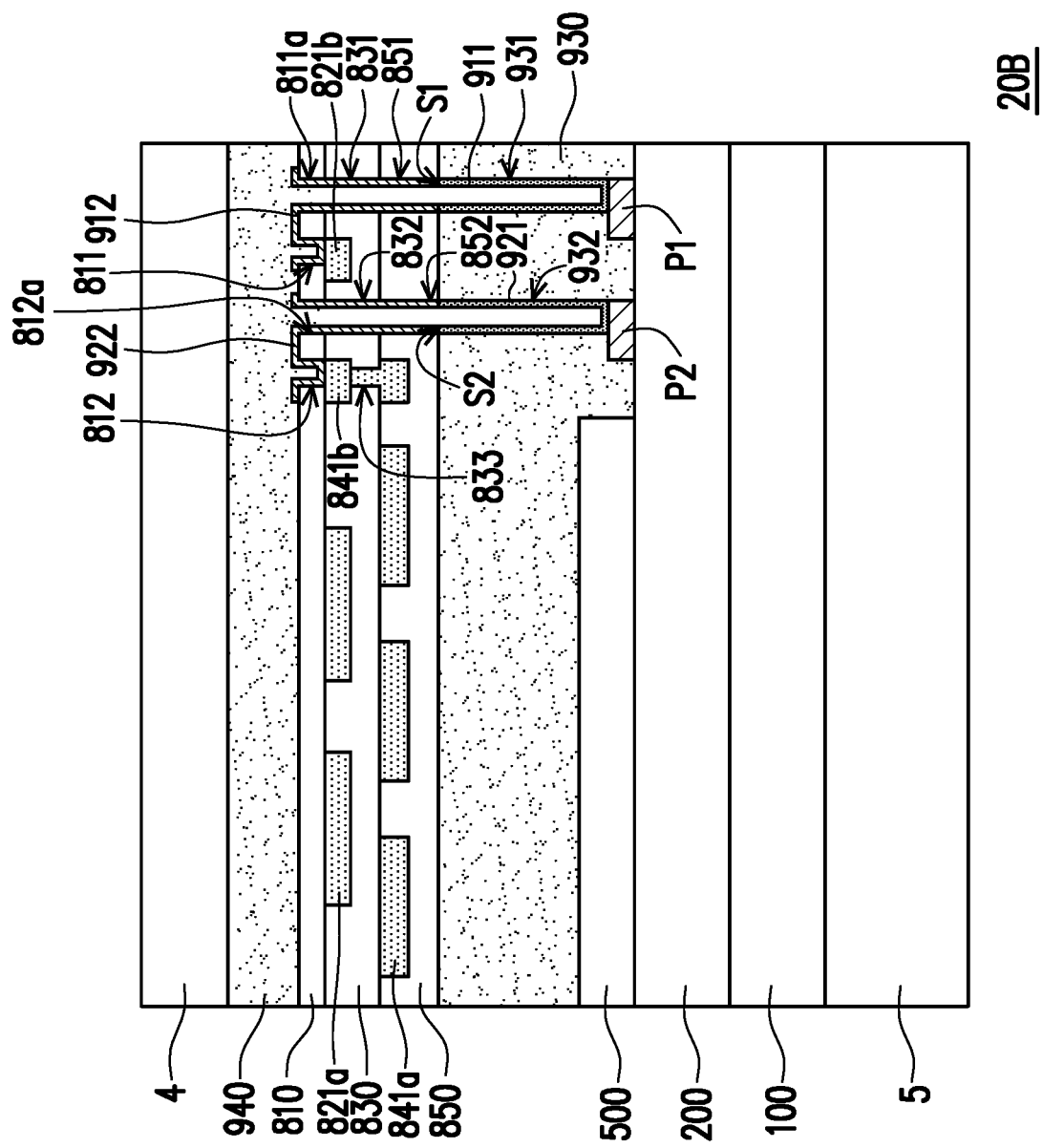
FIG. 10 is a sectional schematic view of a manufacturing process of a display apparatus of a tenth embodiment of the disclosure.

FIG. 10 is a sectional schematic view of a manufacturing process of a display apparatus of a tenth embodiment of the disclosure. A display apparatus 20B of FIG. 10 is similar to the display apparatus 20 of FIG. 8D. The difference of the two display apparatuses lies as follows.

Please refer to FIG. 10. In a manufacturing process of the display apparatus 20B, the first adhesive layer 930 may be formed on the display element layer 500 and the pads P1 and P2; then, before the bonding of the touch element layer 800 with the display element layer 500 and the pads P1 and P2, vias 931 and 932 of the first adhesive layer 930 are formed, and first portions 911 and 921 are formed in the vias 931 and 932 in advance; further, the touch element layer 800 is bonded with the display element layer 500 and the pads P1 and P2; then, the vias 811a and 811b of the buffering sublayer 810, the vias 831 and 832 of the insulating sublayer 830 and the vias 851 and 852 of the insulating sublayer 850 are formed; further, a second portion 912 is formed in the vias 811a, 831 and 851, and a second portion 922 is formed in the vias 812a, 832 and 852, wherein the second portion 912 and the first portion 911 are connected as the conductive element 910, and the second portion 922 and the first portion 921 are connected as the conductive element 920.

Since the first portion 911 and the second portion 912 of the conductive element 910 are formed in different manufacturing processes, the first portion 911 and the second portion 912 of the conductive element 910 has an interface S1. Similarly, since the first portion 921 and the second portion 922 of the conductive element 920 are formed in different manufacturing processes, the first portion 921 and the second portion 922 of the second conductive element 920 has an interface S2.

Although the disclosure has been disclosed in the above embodiments, the embodiments are not intended to limit the disclosure, and those skilled in the art may make some modifications and refinements without departing from the spirit and scope of the disclosure. Therefore, the scope of the disclosure is defined by the claims attached below.

What is claimed is:

1. A display apparatus comprising:
a substrate;
a first circuit layer disposed on the substrate;
a first adhesive layer disposed on the first circuit layer;
a second circuit layer disposed on the first adhesive layer;
a first conductive element disposed on the second circuit layer and electrically connected to the second circuit layer, wherein the first adhesive layer has a first via, and the first conductive element is electrically connected to the first circuit layer through the first via of the first adhesive layer; and
a display element layer disposed on the second circuit layer and electrically connected to the second circuit layer,
wherein the second circuit layer comprises a thin-film transistor having a gate, a semiconductor pattern and an insulating sublayer disposed between the gate and the semiconductor pattern; the insulating sublayer has a first via disposed outside of the semiconductor pattern; the first conductive element is electrically connected to the first circuit layer through the first via of the insulating sublayer of the thin-film transistor of the second circuit layer and the first via of the first adhesive layer.

2. The display apparatus according to claim 1, wherein first via of the insulating sublayer of the thin-film transistor of the second circuit layer and the first via of the adhesive layer are substantively aligned.

3. The display apparatus according to claim 1, wherein the first circuit layer comprises a thin-film transistor, and the first conductive element is electrically connected to the thin-film transistor of the first circuit layer and the thin-film transistor of the second circuit layer.

4. The display apparatus according to claim 3, wherein the first circuit layer further comprises a bus line, and the thin-film transistor of the first circuit layer is electrically connected to the bus line of the first circuit layer; the second circuit layer further comprises a bus line, and thin-film transistor of the second circuit layer is electrically connected to the bus line of the second circuit layer, and the display apparatus further comprises:
a second conductive element disposed on the second circuit layer and electrically connected to the bus line of the second circuit layer, wherein the insulating sublayer of the thin-film transistor of the second circuit layer further has a second via disposed outside of the semiconductor pattern, and the first adhesive layer further has a second via, and the second conductive element is electrically connected to the bus line of the first circuit layer through the second via of the insulating sublayer of the thin-film transistor of the second circuit layer and the second via of the first adhesive layer.

5. The display apparatus according to claim 3, further comprising:
a second adhesive layer disposed between the first circuit layer and the substrate;
a third element layer comprising a bus line, wherein the bus line of the third element layer is disposed between the second adhesive layer and the substrate; and
a third conductive element disposed on the first circuit layer and electrically connected to the thin-film transistor of the first circuit layer, wherein the third conductive element is electrically connected to the bus line of the third element layer through a via of the second adhesive layer.

6. The display apparatus according to claim 5, wherein the thin-film transistor of the first circuit layer has a gate, a semiconductor pattern, and an insulating sublayer disposed between the gate and the semiconductor pattern, and the insulating sublayer of the first circuit layer has a via disposed outside of the semiconductor pattern of the first circuit layer, and the third conductive element is electrically connected to the bus line of the third element layer through the via of the insulating sublayer of the thin-film transistor of the first circuit layer and the via of the second adhesive layer.

7. The display apparatus according to claim 6, wherein the via of the insulating sublayer of the thin-film transistor of the first circuit layer and the via of the second adhesive layer are substantively aligned.

8. The display apparatus according to claim 1, wherein the first circuit layer comprises a bus line and the first conductive element is electrically connected to the bus line of the first circuit layer and the thin-film transistor of the second circuit layer.

9. The display apparatus according to claim 1, wherein the first conductive element comprises:
a first portion at least disposed to the first via of the first adhesive layer; and
a second portion at least disposed to the first via of the insulating sublayer of the thin-film transistor of the second circuit layer, wherein the first portion and the second portion has an interface.

10. The display apparatus according to claim 1, wherein the thin-film transistor of the second circuit layer further has a first electrode and a second electrode, electrically connected to two different areas of the semiconductor pattern respectively, and at least one part of the first conductive element, the first electrode of the thin-film transistor of the second circuit layer and the second electrode of the thin-film transistor of the second circuit layer form in a same film layer.

11. The display apparatus according to claim 1, wherein the display element layer comprises:
   a pixel electrode disposed on the second circuit layer and electrically connected to the second circuit layer;
   a pixel defining layer disposed on the pixel electrode and having a via overlapping the pixel electrode;
   an organic electroluminescent material disposed in the via of the pixel defining layer; and
   a common electrode disposed on the organic electroluminescent material;
   wherein a part of the first conductive element is disposed between the pixel defining layer and the second circuit layer.

12. The display apparatus according to claim 1, wherein a part of the first conductive element is conformally disposed in a groove defined by the first via of the first adhesive layer.

* * * * *